(12) United States Patent
Yaginuma et al.

(10) Patent No.: US 8,143,959 B2
(45) Date of Patent: Mar. 27, 2012

(54) JITTER GENERATION APPARATUS, DEVICE TEST SYSTEM USING THE SAME, AND JITTER GENERATION METHOD

(75) Inventors: Katsuyuki Yaginuma, Koriyama (JP); Tadanori Nishikobara, Ebina (JP)

(73) Assignee: Anritsu Corporation, Atsugi-shi (JP)

(*) Notice: Subject to any disclaimer, the term of this patent is extended or adjusted under 35 U.S.C. 154(b) by 85 days.

(21) Appl. No.: 12/715,092

(22) Filed: Mar. 1, 2010

(65) Prior Publication Data
US 2010/0150218 A1  Jun. 17, 2010

Related U.S. Application Data

(63) Continuation of application No. PCT/JP2008/067320, filed on Sep. 25, 2008.

(30) Foreign Application Priority Data

Sep. 28, 2007  (JP) .................................. 2007-253642

(51) Int. Cl.
H03B 29/00  (2006.01)
(52) U.S. Cl. ........................... 331/78; 332/144; 332/128
(58) Field of Classification Search .................... 331/78; 332/144, 145, 146, 103, 104, 105, 127, 128; 375/226
See application file for complete search history.

(56) References Cited

U.S. PATENT DOCUMENTS

| 6,831,955 | B1* | 12/2004 | Takahashi ...................... 375/298 |
| 2003/0156673 | A1 | 8/2003 | Yanai |
| 2005/0231292 | A1 | 10/2005 | Akahori et al. |
| 2008/0088386 | A1* | 4/2008 | Maeda .......................... 332/144 |

FOREIGN PATENT DOCUMENTS

| JP | 3086706 B2 | 9/2000 |
| JP | A 2001-285043 | 10/2001 |
| JP | A 2004-301539 | 10/2004 |
| JP | A 2005-65220 | 3/2005 |
| WO | WO 97/06600 | 2/1997 |
| WO | WO 03/007578 A1 | 1/2003 |

OTHER PUBLICATIONS

"Calibrated Jitter, Jitter Tolerance Test and Jitter Laboratory with the Agilent J-BERT N4903A,"*Application Note*, Agilent Technologies, Printed in the USA, Jul. 13, 2008, pp. 1-32.
English translation of the IPRP, issued in Int'l. App. No. PCT/JP2008/067320, mailed May 14, 2010.

* cited by examiner

*Primary Examiner* — Ryan Johnson
(74) *Attorney, Agent, or Firm* — Greer, Burns & Crain, Ltd.

(57) ABSTRACT

A jitter generation apparatus for applying a phase modulation to a PLL is controlled by a control unit so as to output a signal with the desired jitter based on a parameters. When a switching unit is switched to a first state, the control unit controls first and second level control units so that the desired jitter in which an amplitude of a first modulation signal matches the parameter is added to an output signal from a voltage controlled oscillator unit, and passes through a quadrature modulator. When the switching unit is switched to the second state, the control unit controls the first and second level control units so that a quadrature modulation is applied to a local signal, which is input to the quadrature modulator without adding any jitter to an output signal from the voltage controlled oscillator unit, and a quadrature-modulated local signal is output.

21 Claims, 15 Drawing Sheets

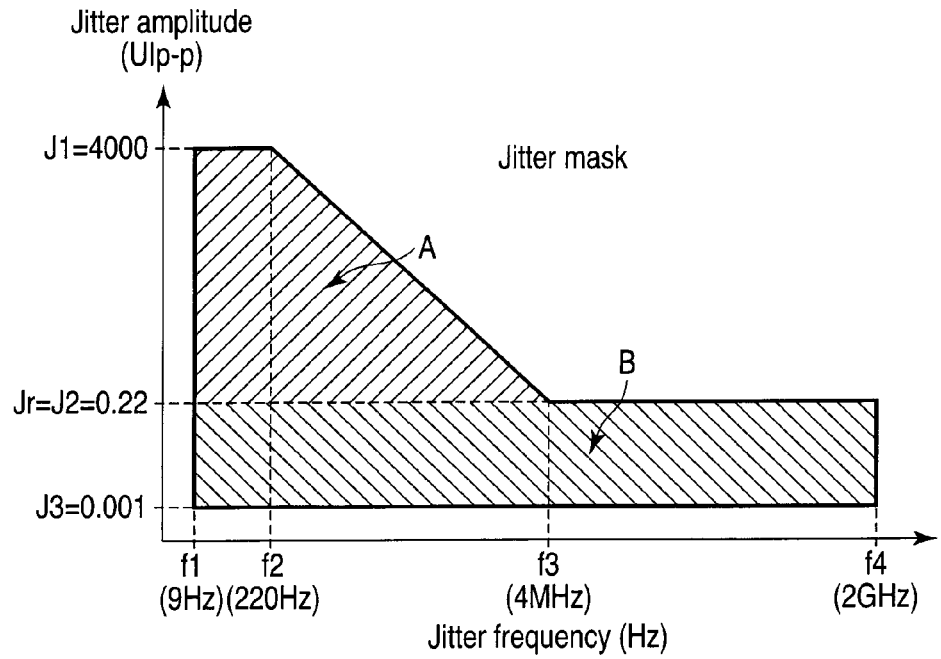
F I G. 2
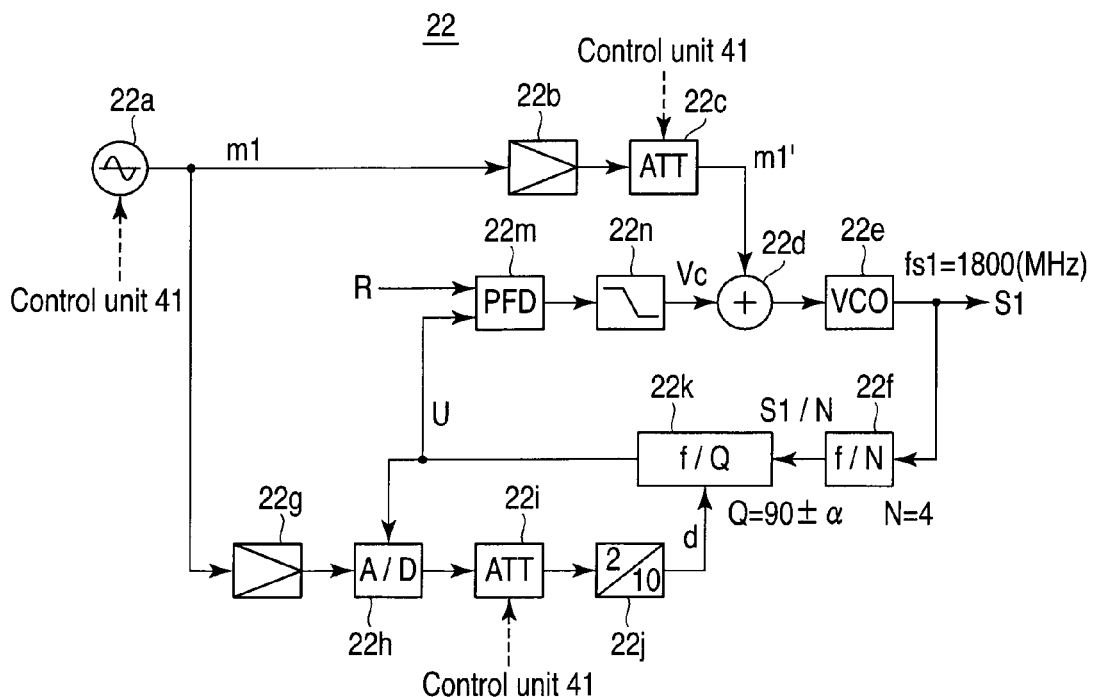
F I G. 3

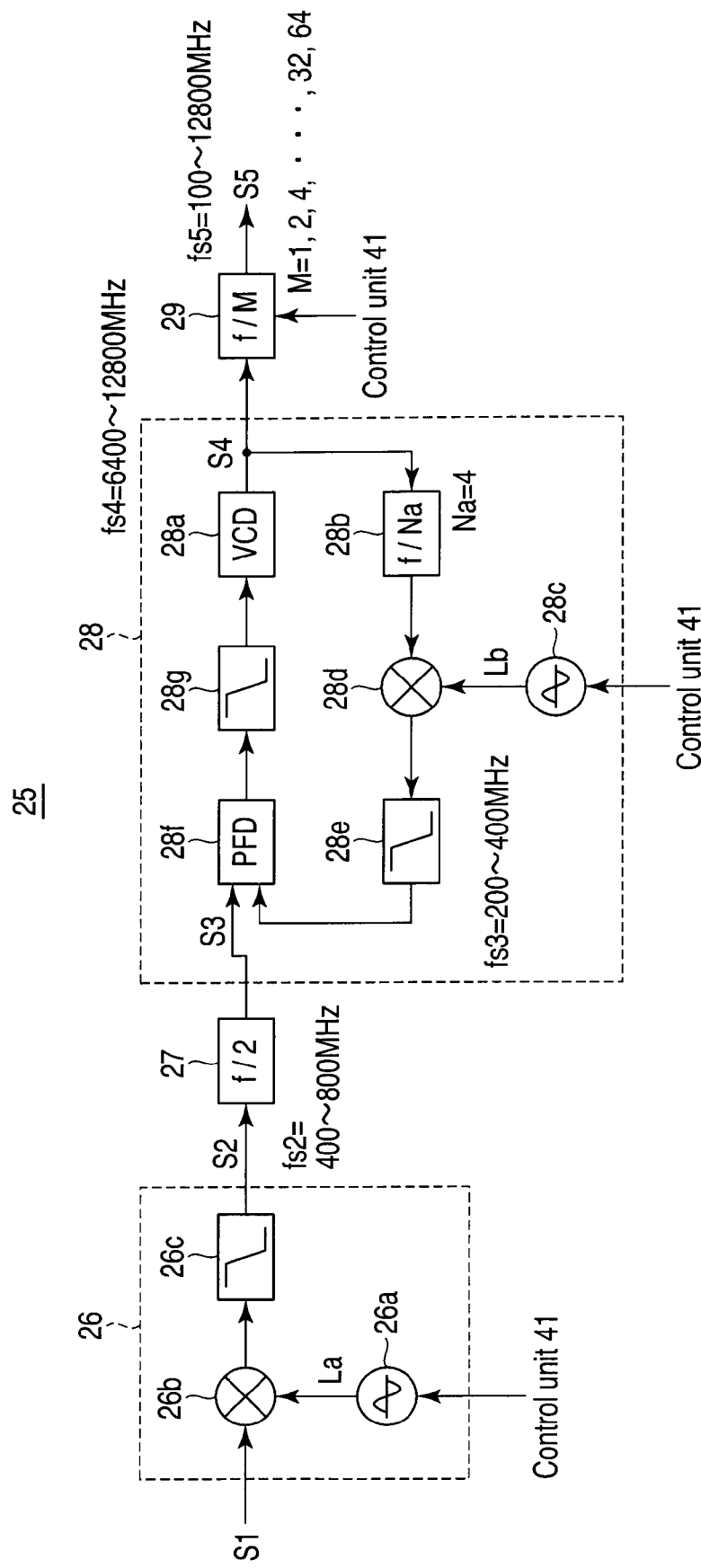
F I G. 4

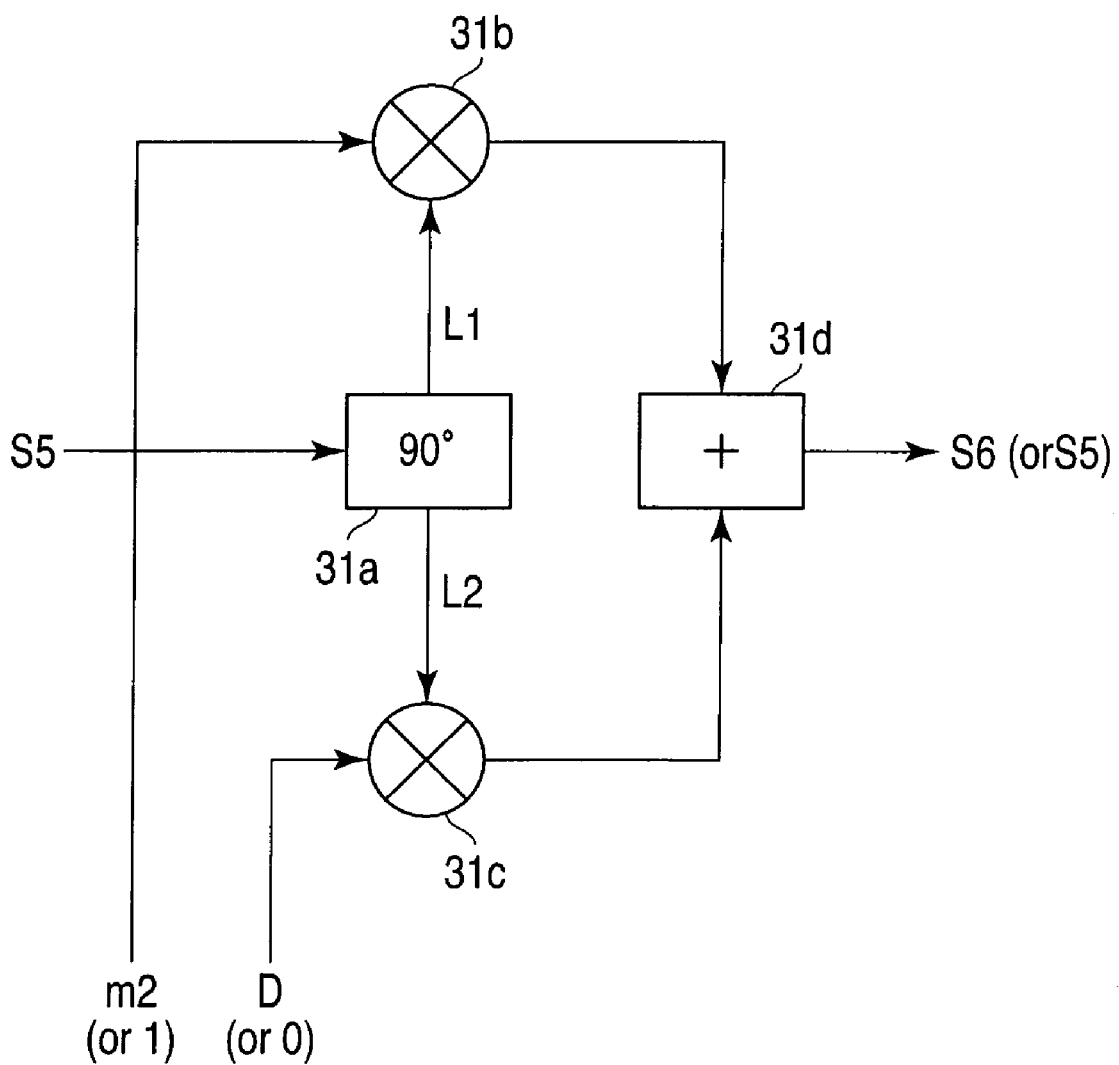
F I G. 5

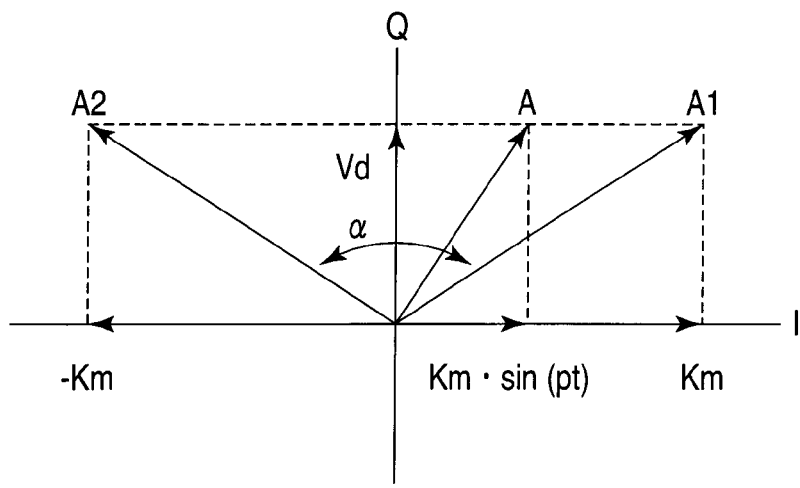
F I G. 6
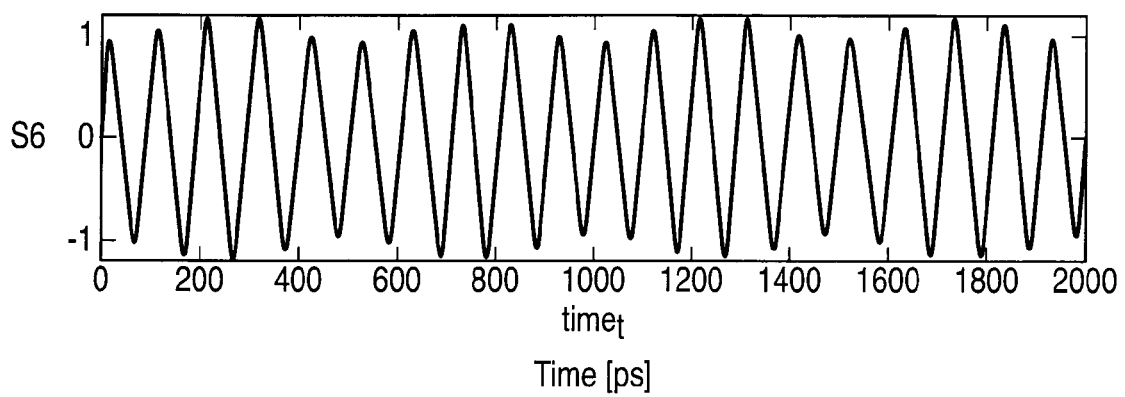
F I G. 7

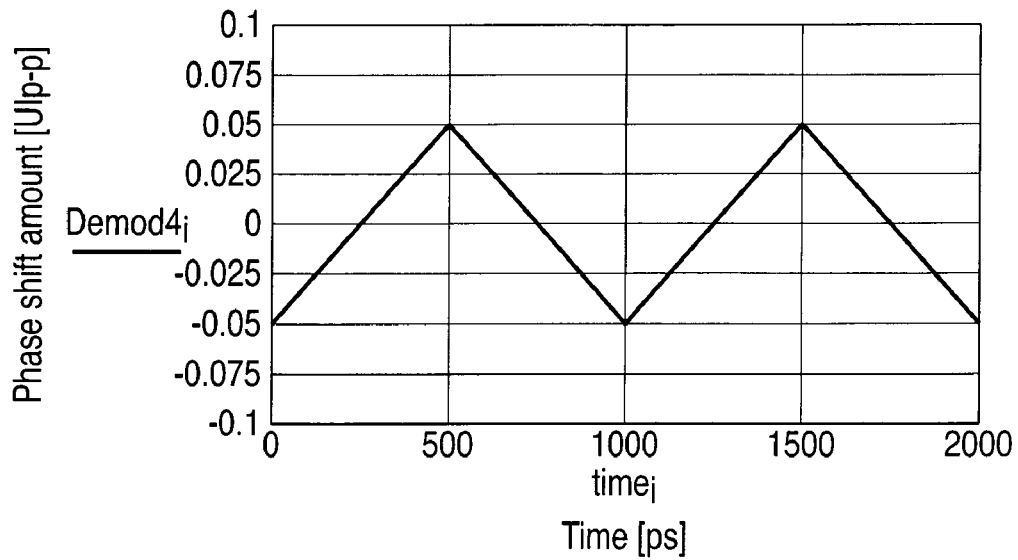
F I G. 11
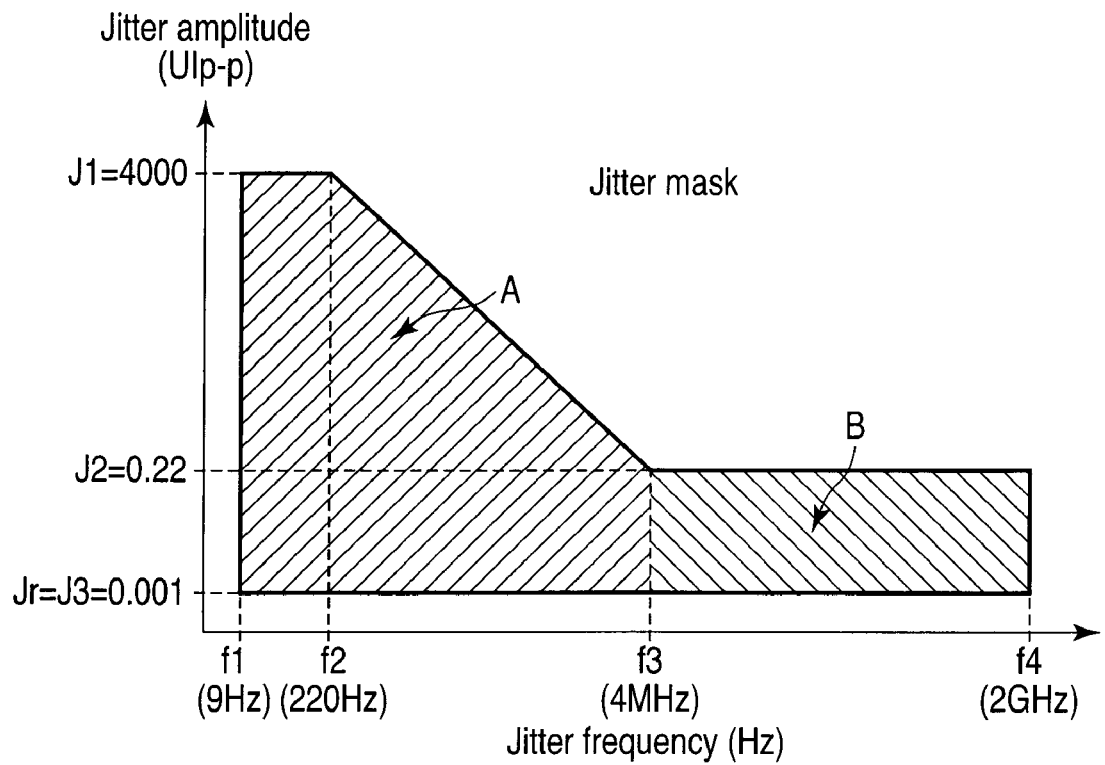
F I G. 12

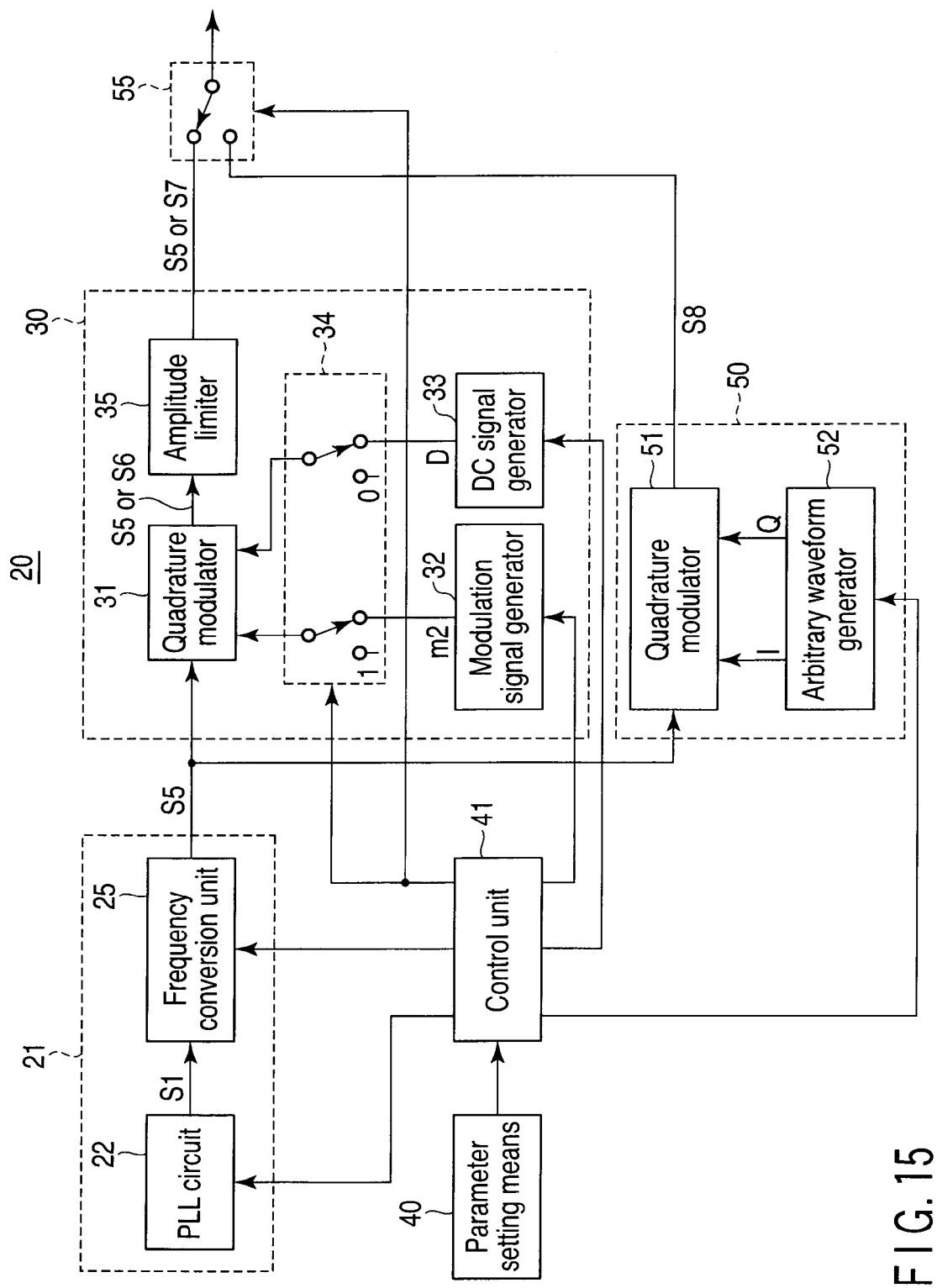
F I G. 15

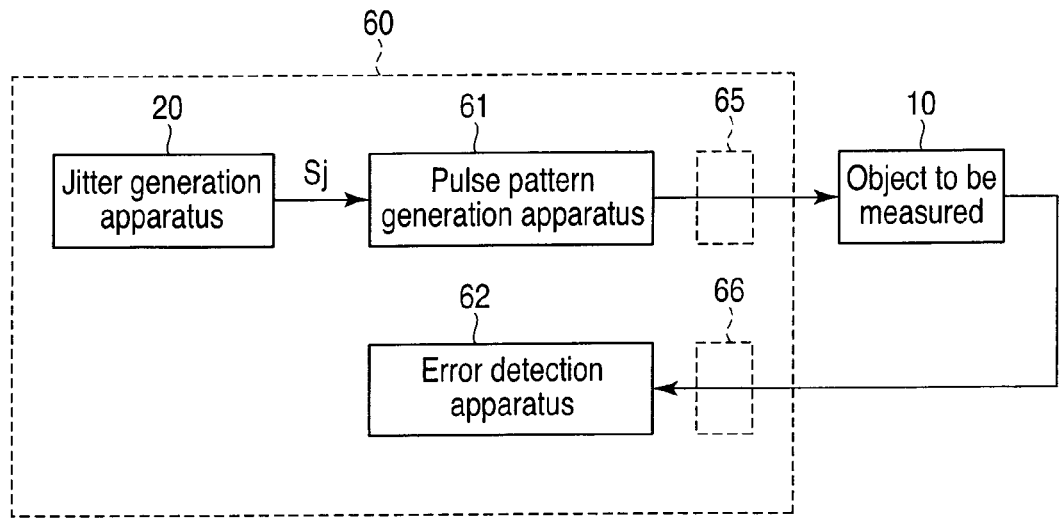
F I G. 16

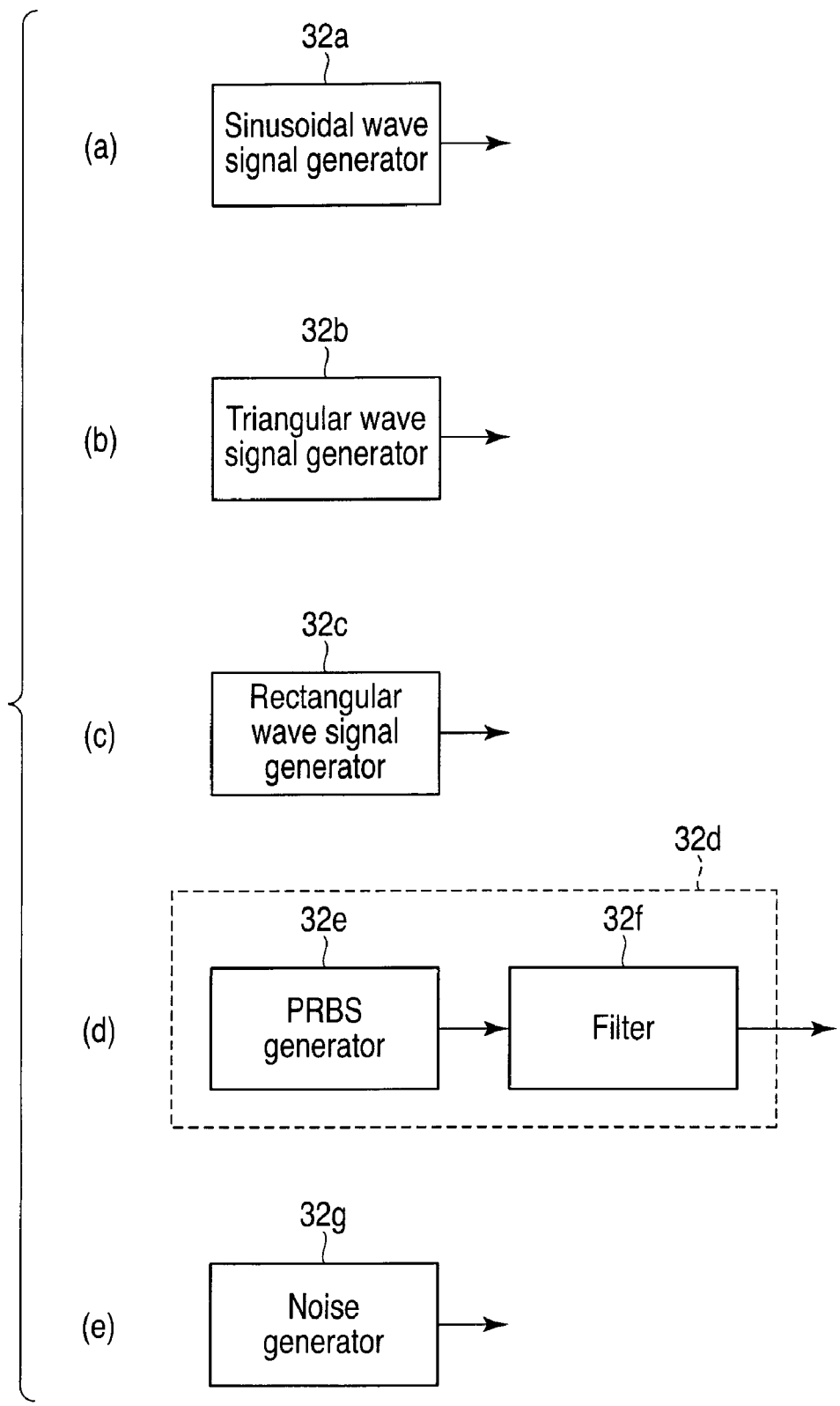
F I G. 19

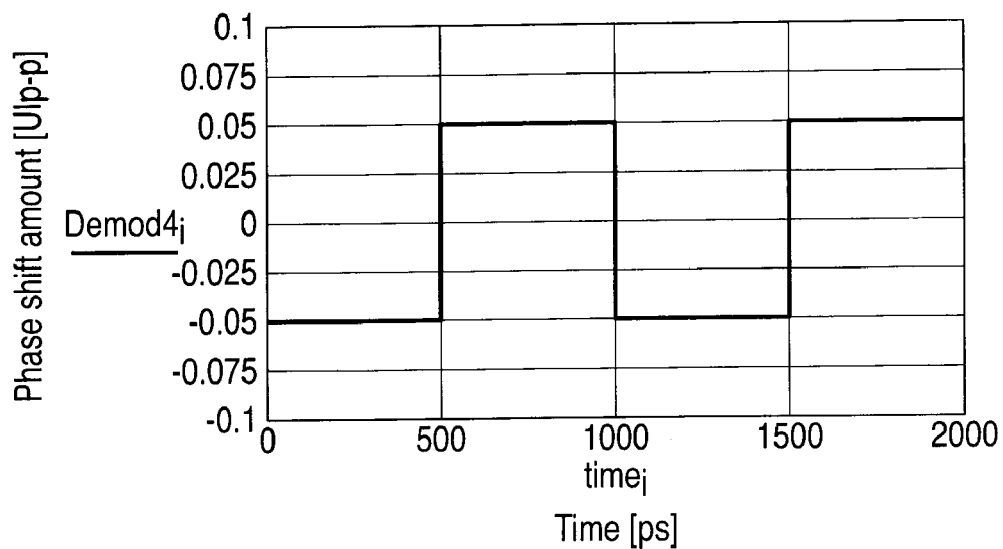
F I G. 20
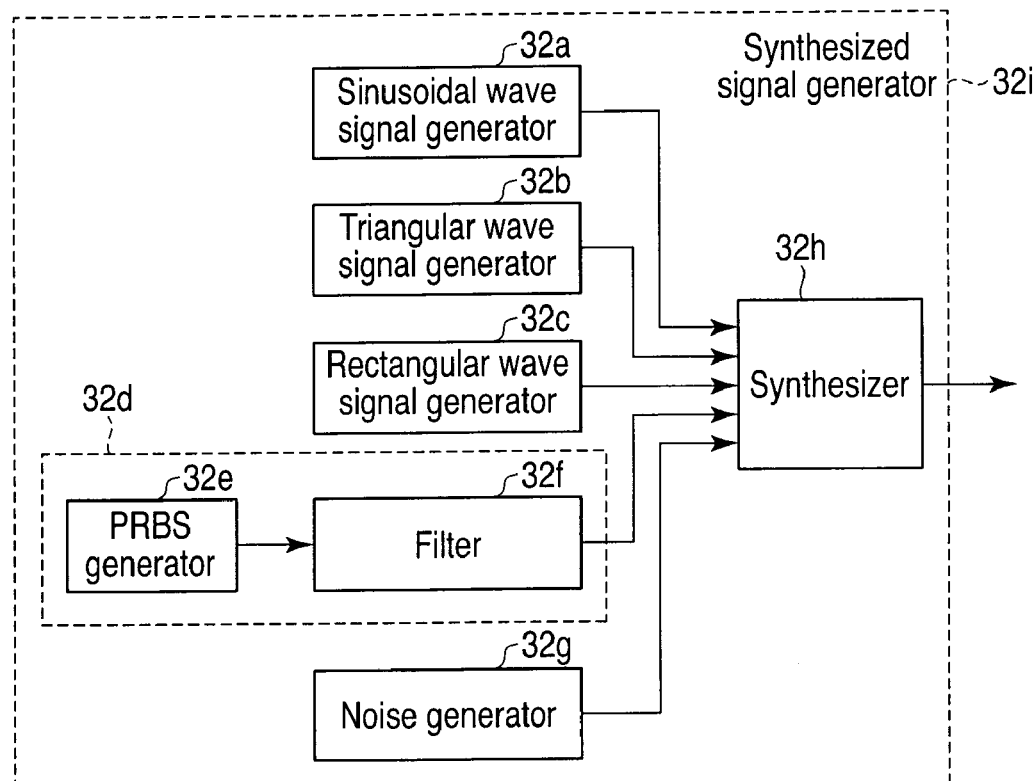
F I G. 21 ically used.

JITTER GENERATION APPARATUS, DEVICE TEST SYSTEM USING THE SAME, AND JITTER GENERATION METHOD

CROSS REFERENCE TO RELATED APPLICATIONS

This is a Continuation Application of PCT Application No. PCT/JP2008/067320, filed Sep. 25, 2008, which was published under PCT Article 21(2) in Japanese.

This application is based upon and claims the benefit of priority from prior Japanese Patent Application No. 2007-253642, filed Sep. 28, 2007, the entire contents of which are incorporated herein by reference.

BACKGROUND OF THE INVENTION

1. Field of the Invention

The present invention relates to a jitter generation apparatus, a device test system using the same, and a jitter generation method and, more particularly, to a jitter generation apparatus which adopts a technique for generating jitters over a broad band, a device test system using the same, and a jitter generation method.

2. Description of the Related Art

Measurement items for a data transmission system include jitter tolerance measurement that measures a tolerance level against a phase fluctuation (jitter) of a data signal.

In general, a jitter tolerance permitted in, e.g., a transmission device has to tolerate jitters having large amplitudes in a low jitter frequency region, and those having relatively small amplitudes in a high jitter frequency region.

A data transmission system to be measured is speeded up year by year, and is required to be able to assign jitters of several GHz to signals having bit rates of several 10 GHz.

Therefore, a jitter generation apparatus used in the jitter tolerance measurement is required to be able to generate jitters having large amplitudes in a low frequency region, and has to accurately generate jitters having even relatively small amplitudes until a high frequency region up to several GHz.

FIG. 17 shows an example of a jitter mask which represents the band and magnitude characteristics of jitters required for the aforementioned jitter generation apparatus.

That is, in this jitter mask, a jitter amplitude upper limit is constant, i.e., 4000 (UIp–p) from a lower limit frequency f1 (e.g., 9 Hz) to a frequency f2 (e.g., 220 Hz).

On the other hand, from the frequency f2 to a frequency f3 (e.g., 4 MHz), the jitter amplitude upper limit monotonically decreases from 4000 (UIp–p) to 0.22 (UIp–p).

Then, from the frequency f3 to an upper limit frequency f4 (e.g., 2 GHz), the jitter amplitude upper limit is constant, i.e., 0.22 (UIp–p).

Furthermore, a jitter amplitude lower limit is 0.001 (UIp–p) in a full band from the lower limit frequency f1 to the upper limit frequency f4.

As a technique for generating jitters over a broad band, a method based on phase modulation using a phase locked loop (PLL) circuit is conventionally used.

This PLL circuit generally has the following arrangement. That is, the PLL circuit generally frequency-divides an output signal from a voltage controlled oscillator (VCO), inputs the frequency-divided output and a reference signal to a phase comparator. Then, the PLL circuit generates a DC control signal required to synchronize the frequency-divided output from the VCO with the reference signal, and supplies the control signal to the VCO.

When this PLL circuit performs phase modulation, a method of applying a modulation signal as the control signal input to the VCO, a method of varying a feedback frequency division ratio in a loop, and the like may be used.

As a method of generating jitters, a method of generating a phase-modulated signal by inputting special waveform signals as I and Q signals of an quadrature modulator using the quadrature modulator is known in addition to the aforementioned method using the PLL circuit.

This method using the quadrature modulator uses the following principle.

Note that the following description will be given taking a signal assigned with a sinusoidal wave jitter as a type of jitter.

A signal assigned with a sinusoidal wave jitter is a signal phase-modulated by a sinusoidal wave, and can be expressed by:

$$Y(t) = \sin[\omega t + m \cdot \sin(pt)]$$

(where m is a modulation index, $\omega$ is a carrier angular frequency, and p is an angular frequency of a modulation signal)

By expanding the above equation, we have:

$$Y(t) = \sin[m \cdot \sin(pt)] \cdot \cos(\omega t) + \cos[m \cdot \sin(pt)] \cdot \sin(\omega t)$$
$$= I(t) \cdot \cos(\omega t) + Q(t) \cdot \sin(\omega t)$$

Therefore, a signal assigned with a jitter of a sinusoidal wave having a desired modulation frequency ($p/2\pi$) and desired modulation depth (2 mradp–p) or (m/$\pi$UIp–p) by inputting I and Q signals which are supplied to the quadrature modulator with respect to a sinusoidal wave signal having the carrier angular frequency $\omega$, and are respectively given by:

$$I(t) = \sin[m \cdot \sin(pt)]$$

$$Q(t) = \cos[m \cdot \sin(pt)]$$

Note that the technique for performing phase modulation by varying the feedback frequency division ratio using the PLL circuit is disclosed in, for example, patent document 1.

Also, the technique for generating jitters using the quadrature modulator is disclosed in non-patent document 1.

The technique for applying phase modulation to a frequency-divided signal by the PLL circuit using the quadrature modulator is disclosed in patent document 1.

Patent Document 1: Japanese Patent No. 3086706 (International Publication WO97/06600)

Patent Document 2: Jpn. Pat. Appln. KOKAI Publication No. 2005-65220

Non-Patent Document 1: "Calibrated Jitter, Jitter Tolerance Test and Jitter Laboratory with the Agilent J-BERT N4903A" application Note (especially, see FIG. 18 of the 9th page)

BRIEF SUMMARY OF THE INVENTION

However, since the method of modulating a phase using the PLL circuit like in patent document 1 is limited by a frequency conversion response speed of an oscillator (for example, the modulation band width in case of the VCO), it is difficult to accurately assign a jitter at a modulation frequency as high as several GHz.

In order to assign a sinusoidal wave jitter having a desired modulation frequency and desired modulation depth by the method of non-patent document 1 which inputs, to the quadrature modulator, the signals respectively given by:

$$I(t)=\sin[m \cdot \sin(pt)]$$

$$Q(t)=\cos[m \cdot \sin(pt)]$$

two arbitrary waveform generators, which independently generate I and Q signals having complicated waveforms (those for one cycle are illustrated), as shown in (a) to (d) of FIG. 18, are required.

The arbitrary waveform generator, which generates the I signal, of these generators has to include a calculation unit which calculates respective data based on above equation $I(t)=\sin[m \cdot \sin(p \cdot t)]$ using the modulation index m which is set in advance in association with a signal I(t) and the angular frequency p of the modulation signal, a memory which stores data calculated by this calculation unit, and a D/A converter which digital/analog (D/A) converts data output from this memory, and outputs an analog signal I(t).

Then, such arbitrary waveform generator outputs the signal I(t) upon reception of sampling clocks which are commonly input to the memory and D/A converter to have a delay time difference corresponding to the read-out time from the memory.

When a sinusoidal wave jitter of a high modulation frequency (e.g., 1 GHz) is to be assigned to a clock signal, the frequency of sampling clocks required to generate the signal I(t) to be input to one phase of the quadrature modulator using 10 data is unwantedly as high as 10 GHz.

Also, when such arbitrary waveform generator uses sampling clocks of 45 MHz to assign a sinusoidal wave jitter of a low modulation frequency (e.g., 10 Hz), since 4,500,000 data are required, this results in a long transfer time from the calculation unit to the memory and a large memory size.

Assuming that sampling clocks of a frequency of 45 MHz are used, when, for example, a sinusoidal wave jitter of 450 kHz is to be assigned, the number of data can be 100. Hence, such implementation is feasible unlike in case of the aforementioned sinusoidal wave jitter of 10 Hz.

As described above, the method disclosed in non-patent document 1 using the quadrature modulator suffers the following problems. That is, it is difficult to assign a jitter of a high modulation frequency, and sampling clocks of a plurality of frequencies are required to assign jitters over a broad range from a low modulation frequency (several Hz) to a high modulation frequency (up to GHz) in consideration of the required numbers of data.

Note that the same problems apply to the other arbitrary waveform generator which generates a signal Q(t).

It is an object of the present invention to provide a jitter generation apparatus, which can solve the aforementioned problems and can generate jitters over a broad range from a low modulation frequency to a high modulation frequency by a simple arrangement, a device test system using the same, and a jitter generation method.

In order to achieve the above object, according to a first aspect of the present invention, there is provided a jitter generation apparatus (20) including an arrangement for applying phase modulation to a phase locked loop (PLL), which comprises:

voltage controlled oscillator means (22e);

frequency divider means (22f, 22k) for frequency-dividing a frequency of a signal output from the voltage controlled oscillator means (22e) at a predetermined frequency division ratio;

phase comparator means (22m) for receiving an output from the frequency divider means (22f, 22k) at one input terminal, receiving a reference clock signal (R) at the other input terminal, comparing the output from the frequency divider means (22f, 22k) with a phase of the reference clock signal (R), and outputting a signal corresponding to a phase difference between the output and the reference clock signal (R);

filter means (22n) for removing a predetermined frequency component from an output signal from the phase comparator means (22m);

jitter addition means (22d) for outputting a signal filtered through the filter means (22n) by adding a predetermined jitter corresponding to an amplitude of a first modulation signal to that signal upon reception of the externally supplied first modulation signal, and controlling a frequency of the signal output from the voltage controlled oscillator means (22e) by the output signal added with the jitter; and frequency division ratio varying means (22h, 22i, 22j) for varying the frequency division ratio of the frequency divider means (22f, 22k) according to the amplitude of the first modulation signal upon reception of the first modulation signal, so as to vary the predetermined jitter added by the jitter addition means (22d), the apparatus (20) further comprising:

first level control means (22c) for performing level control of the first modulation signal and applying a level-controlled first modulation signal to the jitter addition means (22d);

second level control means (22i) for performing level control of first modulation signal and applying a level-controlled modulation signal to the frequency division ratio varying means (22h, 22i, 22j);

parameter setting means (40) for setting parameters associated with a desired jitter to be generated by the jitter generation apparatus (20);

a quadrature modulator (31) which has a local signal input terminal and two modulation signal input terminals, allows a local signal which is input to the local signal input terminal and is output with the jitter added from the voltage controlled oscillator means (22e) to pass through the quadrature modulator (31), and quadrature-modulates a non-modulated local signal which is input to the local signal input terminal and is output without the jitter added from the voltage controlled oscillator means (22e), based on a second modulation signal and outputs quadrature-modulated local signal, in accordance with input states to the two modulation signal input terminals;

amplitude limiting means (35) for limiting an amplitude of the output signal from the quadrature modulator (31) to a constant amplitude;

switching means (34) configured to switch an input state to the two modulation signal input terminals of the quadrature modulator (31) between a first state in which zero is input to one of the two modulation signal input terminals and a nonzero fixed value is input to the other, and a second state in which the second modulation signal is input to at least one of the two modulation signal input terminals; and a control unit (41) which controls the jitter generation apparatus (20) having the arrangement for applying the phase modulation to the PLL to finally output a signal added with the desired jitter based on the parameters set by the parameter setting means (40) from the amplitude limiting means (35), respectively controls, when the switching means (34) is switched to the first state as a result of switching control of the switching means (34) to the first state or the second state, the first level control means (22c) and the second level control means (22i) so that the local signal, which is obtained by adding the desired jitter in which an amplitude of the first modulation signal matches the parameter set by the parameter setting means (40) to the output signal from the voltage controlled oscillator means (22e), passes through the quadrature modulator (31) and is input to the amplitude limiting means (35), and respectively controls, when the switching means (34) is switched to the second state, the first level control means (22c) and the second level control means (22i) so that an output, which is obtained by applying quadrature modulation to the non-modulated local signal which is input to the quadrature modulator (31) without adding any jitter to the output signal from the voltage controlled oscillator means (22e) based on the second modulation signal, is input to the amplitude limiting means (35).

In order to achieve the above object, according to a second aspect of the present invention, there is provided the jitter generation apparatus (20) according to the first aspect, wherein frequency conversion means (25), which is controlled by the control unit (41) so that an output frequency matches a parameter set by the parameter setting means (40), is inserted between the voltage controlled oscillator means (22e) and the quadrature modulator (31).

In order to achieve the above object, according to a third aspect of the present invention, there is provided the jitter generation apparatus (20) according to the second aspect, wherein the frequency conversion means (25) includes a PLL arrangement.

In order to achieve the above object, according to a fourth aspect of the present invention, there is provided the jitter generation apparatus (20) according to the first aspect, wherein in the second state in which the second modulation signal is input to one of the two modulation signal input terminals of the quadrature modulator (31), a DC signal is input to the other of the two modulation signal input terminals.

In order to achieve the above object, according to a fifth aspect of the present invention, there is provided the jitter generation apparatus (20) according to the first aspect, further comprising first modulation signal generation means (22a) for generating the first modulation signal.

In order to achieve the above object, according to a sixth aspect of the present invention, there is provided the jitter generation apparatus (20) according to the fifth aspect, wherein the first modulation signal generation means (22a) comprises a modulation signal generator (22a) having a direct digital synthesizer (DDS) arrangement, which is controlled by the control unit (41) so that a frequency of the first modulation signal matches a parameter set by the parameter setting means (40).

In order to achieve the above object, according to a seventh aspect of the present invention, there is provided the jitter generation apparatus (20) according to the first aspect, further comprising modulation signal generation means (32, 33) (32) for generating the second modulation signal.

In order to achieve the above object, according to an eighth aspect of the present invention, there is provided the jitter generation apparatus (20) according to the seventh aspect, wherein the modulation signal generation means (32, 33) (32) includes at least one of a sinusoidal wave signal generator (32a), a triangular wave signal generator (32b), a rectangular wave signal generator (32c), a pseudo random binary sequence (PRBS) control signal generator (32d), and a white noise generator (32e), or means for generating a synthesized wave signal obtained by synthesizing at least two types of signals therefrom.

In order to achieve the above object, according to a nine aspect of the present invention, there is provided the jitter generation apparatus (20) according to the first aspect, wherein the quadrature modulator (31) applies quadrature modulation to a local signal, which is input from the voltage controlled oscillator means (22e) to the local signal input terminal in a third state, based on arbitrary waveform signals (I, Q) of two phases output from an arbitrary waveform generator (38) to one and the other of the two modulation signal input terminals, and outputs the quadrature-modulated local signal as a signal added with the desired jitter based on the parameters set by the parameter setting means (40), the switching means (34) is configured to switch to the third state in which the arbitrary waveform signals (I, Q) of the two phases are input from the arbitrary waveform generator (38) to one and the other of the two modulation signal input terminals, and when the switching means (34) is switched to the third state as a result of switching control of the switching means (34) to the third state based on the parameters set by the parameter setting means (40), the control unit (41) respectively controls the first level control means (22c) and the second level control means (22i) so as not to add any jitter to the output signal from the voltage controlled oscillator means (22e).

In order to achieve the above object, according to a tenth aspect of the present invention, there is provided the jitter generation apparatus (20) according to the first aspect, further comprising:

a second quadrature modulator (51) which has a local signal input terminal and two modulation signal input terminals, applies quadrature modulation to a local signal, which is input from the voltage controlled oscillator means (22e) to the local signal input terminal, based on arbitrary waveform signals (I, Q) of two phases output from an arbitrary waveform generator (52) to one and the other of the two modulation signal input terminals, and outputs the quadrature-modulated local signal as a signal added with a jitter based on the parameters set by the parameter setting means (40); and second switching means (34) for switching to output an output signal from the amplitude limiting means (35) in the first state and the second state, and to output an output signal from the second quadrature modulator (51) in a third state, wherein when the second switching means (34) is switched to the third state as a result of switching control of the second switching means (34) to the third state based on the parameters set by the parameter setting means (40), the control unit (41) respectively controls the first level control means (22c) and the second level control means (22i) so as not to add any jitter to an output signal from the voltage controlled oscillator means (22e).

In order to achieve the above object, according to an eleventh aspect of the present invention, there is provided a jitter generation method for generating a signal assigned with a jitter within a range of a jitter mask specified by upper and lower limit jitter frequencies and upper and lower limit jitter amplitudes, comprising the steps of:

preparing a first jitter generation unit (21) which generates a signal (S5) assigned with a jitter in a first jitter region which corresponds to a range of a jitter frequency from the lower limit frequency (f1) to a frequency (f3) lower than the upper limit frequency (f4), and in which a jitter amplitude is not less than a reference amplitude (Jr), within the range of the jitter mask;

preparing a second jitter generation unit (30) which generates a signal (S7) assigned with a jitter in a second jitter region which corresponds to a range of a jitter frequency from the upper limit frequency (f4) to the lower limit frequency (f1), in which a jitter amplitude is not more than the reference amplitude (Jr), and which does not overlap the first jitter region, within the range of the jitter mask; and preparing parameter setting means (40) for setting parameters associated with a desired jitter to be generated within the range of the jitter mask, wherein the first jitter generation unit (21) generates a signal assigned with a jitter by a PLL circuit (22) that allows phase modulation by a first modulation signal when the first jitter generation unit (21) generates the signal assigned with the jitter in the first jitter region based on the parameters set by the parameter setting means (40), and generates a signal in a non-modulated state without any jitter assigned when the second jitter generation unit (30) generates the signal assigned with the jitter in the second jitter region, and the second jitter generation unit (30) uses quadrature modulator means (31) for applying quadrature modulation to the signal in the non-modulated state without any jitter assigned, which signal is generated by the PLL circuit (22) of the first jitter generation unit (21), when the second jitter generation unit (30) generates the signal assigned with the jitter in the second jitter region based on the parameters set by the parameter setting means (40).

In order to achieve the above object, according to a twelfth aspect of the present invention, there is provided the jitter generation method according to the eleventh aspect, wherein the step of preparing a second jitter generation unit (30) comprises the steps of:

preparing modulation signal generation means (32, 33) for generating an AC modulation signal (m2) and a DC signal (D) of a predetermined voltage;

preparing the quadrature modulator means (31) for quadrature-modulating an input signal when the modulation signal is input to one phase and the DC signal is input to the other phase; and preparing amplitude limiting means (35) for performing amplitude limiting processing to an output signal from the quadrature modulator means (31), and outputting a modulated signal, a phase of which is modulated based on the modulation signal.

In order to achieve the above object, according to a thirteenth aspect of the present invention, there is provided the jitter generation method according to the eleventh aspect, wherein a region in which a jitter frequency is less than a frequency (f3) lower than the upper limit frequency (f4), and a jitter amplitude is not more than the reference amplitude (Jr) and is not less than a lower limit value within the range of the jitter mask is included in the first jitter region.

In order to achieve the above object, according to a fourteenth aspect of the present invention, there is provided the jitter generation method according to the eleventh aspect, wherein a range of a jitter frequency which ranges from a first frequency lower than the upper limit frequency (f4) to a frequency that is higher than the first frequency and is lower than the upper limit frequency (f4) is set as a third jitter region (C), and the method further comprises the step of preparing a third jitter generation unit (50) which generates a signal (S8) assigned within a jitter associated with the third jitter region (C).

In order to achieve the above object, according to a fifteenth aspect of the present invention, there is provided a device test system using a jitter generation apparatus (20) according to any one of the first to tenth aspects, comprising:

a pulse pattern generation apparatus (61) which receives a signal output from the jitter generation apparatus (20) as a clock signal, and generates a digital signal sequence of a desired pattern, a phase of which is modulated based on the clock signal; and a bit error detection apparatus (62) which detects a bit error of a digital signal sequence output from an object to be measured that receives the digital signal sequence generated by the pulse pattern generation apparatus (61).

BRIEF DESCRIPTION OF THE SEVERAL VIEWS OF THE DRAWING

FIG. 2 is a graph for explaining an example of region divisions (two divisions) of a jitter mask in the jitter generation apparatus and jitter generation method according to the first embodiment of the present invention;

FIG. 3 is a block diagram for explaining an example of the principal part arrangement of a PLL circuit used in the jitter generation apparatus and jitter generation method according to the first embodiment of the present invention;

FIG. 4 is a block diagram for explaining an example of the principal part arrangement of a frequency conversion circuit used in the jitter generation apparatus and jitter generation method according to the first embodiment of the present invention;

FIG. 5 is a block diagram for explaining an example of the principal part arrangement of a quadrature modulator used in the jitter generation apparatus and jitter generation method according to the first embodiment of the present invention;

FIG. 6 is a diagram for explaining an operation example of the principal part of the quadrature modulator used in the jitter generation apparatus and jitter generation method according to the first embodiment of the present invention;

FIG. 7 is a chart for explaining a time waveform of an output from the quadrature modulator used in the jitter generation apparatus and jitter generation method according to the first embodiment of the present invention;

FIG. 11 is a graph for explaining a demodulated waveform of a signal assigned with a triangular wave jitter by the second jitter generation unit used in the jitter generation apparatus and jitter generation method according to the first embodiment of the present invention;

FIG. 12 is a graph for explaining another example of region divisions (two divisions) of a jitter mask used in a jitter generation apparatus and jitter generation method according to the second embodiment of the present invention;

FIG. 15 is a block diagram for explaining an example of the principal part arrangement of an arbitrary waveform generator used in a jitter generation apparatus according to the fourth embodiment of the present invention;

FIG. 16 is a block diagram for explaining the arrangement of a device test system according to the 10th embodiment of the present invention;

FIG. 19 shows block diagrams (a) to (e) (for explaining practical examples of a modulation signal generator for generating a second modulation signal used in a jitter generation apparatus according to the present invention;

FIG. 20 is a graph for explaining a demodulated waveform of a signal assigned with a rectangular wave jitter by a second jitter generation unit used in the jitter generation apparatus according to the present invention; and FIG. 21 is a block diagram for explaining a practical example of a synthesized signal generator for generating a synthesized wave as a second modulation signal used in the jitter generation apparatus according to the present invention.

DETAILED DESCRIPTION OF THE INVENTION

Embodiments of a jitter generation apparatus according to the present invention, a device test system using the same, and a jitter generation method according to the present invention will be described hereinafter with reference to the drawings.

Embodiments of a jitter generation apparatus and jitter generation method according to the present invention will be described first with reference to the drawings.

First Embodiment

Figure 1:
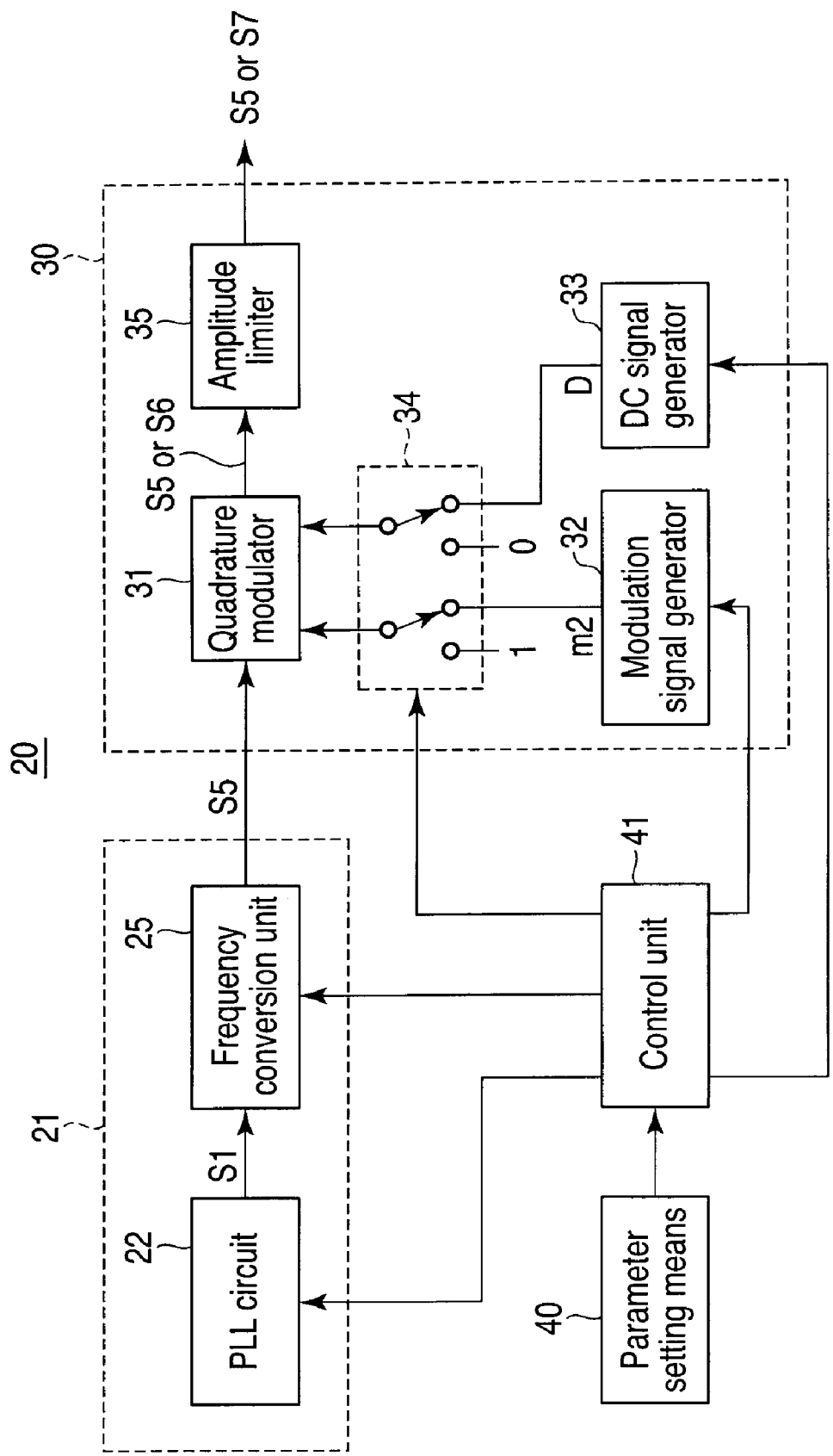
FIG. 1 is a block diagram for explaining the arrangement of a jitter generation apparatus and jitter generation method according to the first embodiment of the present invention.

FIG. 1 is a block diagram for explaining the arrangement and operation of a jitter generation apparatus 20 and jitter generation method to which the first embodiment according to the present invention is applied.

The jitter generation apparatus 20 according to the first embodiment includes a first jitter generation unit 21, second jitter generation unit 30, parameter setting means 40, and control unit 41.

This jitter generation apparatus 20 generates and outputs a signal assigned with a jitter having an arbitrary jitter frequency and jitter amplitude, which are designated in a jitter mask shown in FIG. 2.

Figure 17:
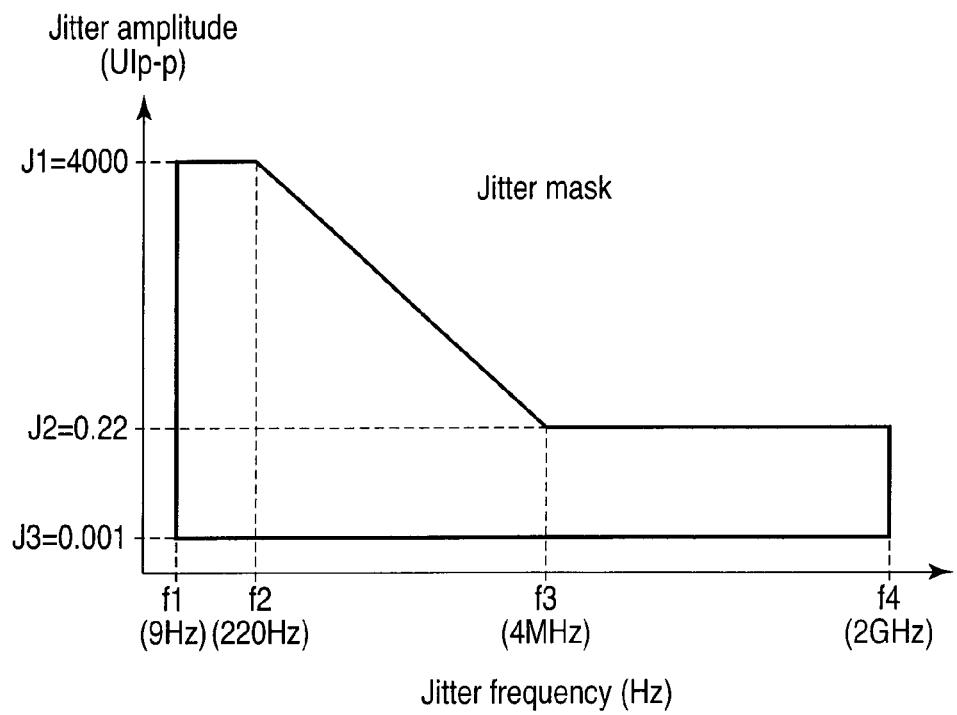
FIG. 17 is a graph for explaining an example of a jitter mask of a conventional method.

Note that the jitter mask shown in FIG. 2 has a constant jitter amplitude upper limit, i.e., 4000 (UIp-p)=J1 from a lower limit frequency f1 (e.g., 9 Hz) to a frequency f2 (e.g., 220 Hz) as in the aforementioned jitter mask shown in FIG. 17.

From the frequency f2 to a frequency f3 (e.g., 4 MHz), the jitter amplitude upper limit monotonically decreases from 4000 (UIp-p) to 0.22 (UIp-p)=J2.

Then, from the frequency f3 to an upper limit frequency f4 (e.g., 2 GHz), the jitter amplitude upper limit is constant, i.e., 0.22 (UIp-p).

Furthermore, a jitter amplitude lower limit is 0.001 (UIp-p) in a full band from the lower limit frequency f1 to the upper limit frequency f4.

In this jitter generation apparatus 20, a first jitter region A in which a jitter frequency falls within a range from the lower limit frequency f1 to the frequency f3 lower than the upper limit frequency f4, and a jitter amplitude is equal to or larger than a reference amplitude Jr=J2, and a second jitter region B in which a jitter frequency falls within a range from the upper limit frequency f4 to a frequency lower than that upper limit frequency f4 and which does not overlap the first jitter region A are assured within the range of the jitter mask shown in FIG. 2.

Note that in this embodiment, the jitter frequency f3 and jitter amplitude J2 define a boundary of regions which divide the jitter mask into two, a region which is less than the jitter frequency f3 and exceeds the jitter amplitude J2 is set as the first jitter region A, and a region equal to or smaller than the jitter amplitude J2 is set as the second jitter region B.

This apparatus is configured to generate jitters in the first jitter region A using the first jitter generation unit 21 shown in FIG. 1, and those in the second jitter region B using the second jitter generation unit 30 shown in FIG. 1.

The first jitter generation unit 21 has a PLL circuit 22 which can attain phase modulation, and a frequency conversion unit 25 which performs frequency conversion processing (including heterodyne conversion, multiplications, and frequency-divisions) with respect to an output signal S1 from this PLL circuit 22 to convert the output signal S1 into a signal S5 having a desired output frequency.

The PLL circuit 22 is of frequency-division feedback type, and is configured to have an operation mode for varying a frequency division ratio according to a modulation signal m1 (to be described later), and an operation mode for adding the modulation signal m1 to a control signal Vc and supplying the sum signal to a VCO, and to generate jitters over a broad amplitude range.

For example, in the PLL circuit 22 shown in FIG. 3, the modulation signal m1 used in a band from the frequencies f1 (9 Hz) to f3 (4 MHz) shown in FIG. 2 is generated by a modulation signal generator 22a having a direct digital synthesizer (DDS) arrangement, and is added as a modulation signal m1' to the control signal Vc by an adder 22d as a jitter addition means via an amplifier 22b and a variable attenuator (ATT) 22c as a first level control means.

In this way, the signal added by the adder 22d is input to a VCO 22e, which generates a signal with a jitter on which modulations in both the operation modes are superposed.

As a result, the generated signal with the jitter has a constant jitter amplitude over a broad frequency band of the modulation signal m1.

In this case, the VCO 22e oscillates and outputs a signal S1 having, for example, 1,800 MHz as a center frequency fs1, and the frequency fs1 of the output signal S1 is frequency-divided by N by a fixed frequency divider 22f having a frequency division ratio N (e.g., N=4) to obtain fs1/N.

The modulation signal m1 is amplified by an amplifier 22g, and is then converted into a binary digital value by an analog/digital (A/D) converter 22h.

The modulation signal m1 which is converted into the binary digital value is converted into a decimal value by a decimal converter 22j via a digital variable attenuator (ATT) 22i as a second level control means, and is then input to a variable frequency divider 22k as frequency division data d.

This variable frequency divider 22k frequency-divides by Q the output signal S1/N from the fixed frequency divider 22f, and outputs the frequency-divided output to a phase comparator 22m of phase-frequency comparison type.

In this case, the variable frequency divider 22k gives a phase change corresponding to the modulation signal m1 by changing its frequency division ratio Q by adding an integer part (±α) of an accumulated (ΣΔ) value of a value Δ decided based on the frequency division data d to a predetermined value P (e.g., 90) (Q=P±α).

The phase comparator 22m performs phase comparison between a reference signal R of a frequency fr (e.g., 5 MHz) and an output signal U from the variable frequency divider 22k, and outputs a signal corresponding to the phase comparison result to a loop filter 22n.

The loop filter 22n extracts a low-frequency control signal Vc whose voltage changes according to a phase difference between the reference signal R and the output signal U from the variable frequency divider 22k.

Then, this control signal Vc is supplied to the VCO 22e via the adder 22d.

The PLL circuit 22 with the aforementioned arrangement executes feedback control, so that the output signal U from the variable frequency divider 22k, which is input to the phase comparator 22m, is synchronized with the reference signal R.

When the frequency of the modulation signals m1 and m1' falls within a loop band of the loop filter 22n, a contribution of the control signal Vc with respect to the jitter amplitude becomes larger than that of the modulation signal m1'.

Conversely, when the frequency of the modulation signals m1 and m1' falls outside the loop band of the loop filter 22n, a contribution of the control signal Vc with respect to the jitter amplitude becomes smaller than that of the modulation signal m1'.

When the frequency of the modulation signals m1 and m1' is equal to the cutoff frequency of the loop band of the loop filter 22n, a contribution of the control signal Vc with respect to the jitter amplitude is nearly equal to that of the modulation signal m1'.

Therefore, as described above, the jitter amplitude becomes constant over a broad frequency band of the modulation signal m1.

Note that the frequency (carrier frequency) of the signal S1 is fixed (1,800 MHz), but it may be configured to be variable at predetermined steps within a predetermined range.

This output signal S1 is input to the frequency conversion unit 25, and is converted into a desired output frequency by heterodyne conversion, multiplications, frequency divisions, and the like.

This frequency conversion unit 25 uses a frequency conversion circuit 26 with a heterodyne arrangement in which, for example, a mixer 26b mixes the signal S1 and a local signal La from a local signal generator 26a, which can vary a frequency within a range from 2200 to 2600 MHz, and a filter 26c extracts difference frequency components between these signals, as shown in FIG. 4.

This frequency conversion circuit 26 converts the signal S1 into a signal S2 within, e.g., a range from 400 to 800 MHz.

Then, this signal S2 is converted by a ½ frequency divider 27 into a signal S3 within a range from 200 to 400 MHz.

This signal S3 is input to a frequency conversion circuit 28 of a PLL arrangement.

This frequency conversion circuit 28 is used to convert the signal S3 into a signal S4 ranging from 6,400 to 12,800 MHz including an upper limit output frequency, and controls a VCO 28a to oscillate the signal S4 within the range from 6,400 to 12,800 MHz.

The signal S4 is input to a frequency divider 28b, and is frequency-divided by Na (Na=4).

The frequency-divided output from this frequency divider 28b and a local signal Lb which is output from a local signal generator 28c to fall within, e.g., a range from 1,600 to 3,200 MHz are input to a mixer 28d.

Then, the output from the mixer 28d is input to a filter 28e to extract difference frequency components within a range from 200 to 400 MHz.

The output from the filter 28e is supplied to a phase comparator 28f.

The phase comparator 28f performs phase comparison between the output from the filter 28e and the signal S3 from the ½ frequency divider 27, and supplies a comparison result to a loop filter 28g.

The loop filter 28g generates a control signal used to synchronize the two signals to be supplied to the phase comparator 28f, and supplies that control signal to the VCO 28a.

Letting fs3 be the frequency of the signal S3 and fL be the frequency of the local signal Lb, a frequency fs4 of the output signal S4 from the frequency conversion circuit 28 with such PLL arrangement is expressed by:

$$fs4=Na(fL\pm fs3)$$

The signal S4 which is obtained in this way and has a frequency ranging from 6400 to 12800 MHz is input to a programmable frequency divider 29 to be frequency-divided by M (M=1, 2, 4, . . . , 32, 64).

Assuming that a desired output frequency range is 100 MHz to 12.5 GHz, a signal S5 falling within ranges:

100 to 200 MHz when M=64,
200 to 400 MHz when M=32,
. . .
3.2 to 6.4 GHz when M=2
6.4 to 12.8 GHz when M=1 is obtained according to the values of M.

To the signal S5 obtained in this way, the PLL circuit 22 assigns a jitter, as described above.

Hence, the jitter frequency and jitter amplitude assigned by the PLL circuit 22 change by the frequency conversion processing in the frequency conversion unit 25.

Therefore, the control unit 41 applies phase modulation to the PLL circuit 22 in consideration of the frequency conversion processing in the frequency conversion unit 25 according to parameter settings of a jitter frequency, jitter amplitude, and the like by the parameter setting means 40, as will be described later, thus obtaining the signal S5 assigned with a desired jitter.

Since the jitter of the signal S5 obtained in this manner is assigned by applying phase modulation to the PLL circuit 22, it can be accurately assigned within the first jitter region A, which corresponds to a low-frequency band and a relatively large amplitude range.

Note that the control unit 41 is also configured to control the first jitter generation unit 21 to output the output signal S5 which is set in a non-modulated state so as not to apply any phase modulation by the PLL circuit 22 according to the parameter settings by the parameter setting means 40, as will be described later.

On the other hand, the second jitter generation unit 30 used to generate jitters in the second jitter region B is configured to assign high-speed jitters that cover several GHz by a simple arrangement, and includes a quadrature modulator 31, a modulation signal generator 32 and DC signal generator 33 which form a modulation signal generation means, a switch 34, and an amplitude limiter 35.

This second jitter generation unit 30 simplifies its arrangement since it uses the output signal S5 which is output from the first jitter generation unit 21 and is set in a non-modulated state, as described above, as a local signal for quadrature modulation.

Note that the modulation signal generator 32 can be commonly used as the modulation signal generator 22a of the first jitter generation unit 21.

The quadrature modulator 31 generates local signals L1 and L2 of two phases having a 90° phase difference by supplying the output signal S5 which is output from the first jitter generation unit 21 and is set in a non-modulated state to a 90° phase shifter 31a, as shown in FIG. 5.

These local signals L1 and L2 of two phases are respectively supplied to input terminals on one side of two mixers 31b and 31c.

Input terminals on the other side of the mixers 31b and 31c have the following cases. That is, in one case, an AC (for example, sinusoidal wave) second modulation signal m2 output from the modulation signal generator 32 is input to one of the input terminals, and a DC signal D of a nonzero predetermined voltage Vd output from the DC signal generator 33 is input to the other. In the other case, zero is input to one of the input terminals, and a nonzero fixed value is input to the other.

The outputs from the two mixers 31b and 31c are added by a synthesizer 31d.

In the case in which the AC (for example, sinusoidal wave) second modulation signal m2 output from the modulation signal generator 32 is input to one of the input terminals on the other side of the mixers 31b and 31c via the switch 34, and the DC signal D of the nonzero predetermined voltage Vd output from the DC signal generator 33 is input to the other via the switch 34, letting ω be the angular frequency of the local signals L1 and L2, and Km·sin(pt) be the second modulation signal m2, an output signal S6 of the quadrature modulator 31 can be expressed by:

$$S6 = Km \cdot \sin(pt) \cdot \cos(\omega t)$$

(where Km is an amplitude coefficient, and p is the angular frequency of the second modulation signal m2)

FIG. 6 shows a vector diagram which expresses the above equation on an I-Q plane.

The first term Km·sin(pt) of the above equation expresses a vector which shifts between +Km and −Km on an I-axis, and the second term of the above equation expresses a vector of a fixed value Vd on a Q-axis perpendicular to the I-axis.

Letting A be the sum of these two vectors, A1 be a vector sum when sin(pt)=1, and A2 be a vector sum when sin(pt)=−1, A shifts between A1 and A2, and this shift amount corresponds to a phase shift amount of the output S6.

An angle α shown in FIG. 6 expresses a phase shift amount of a sinusoidal wave jitter, which can be quantitatively calculated by an approximation expression tan(α/2)=Km/Vd when α is equal to or smaller than π/10.

Even when Km is set to be sufficiently larger than Vd or when Vd is set to be sufficiently smaller than Km, the phase shift amount a never exceeds π.

That is, the amplitude of a jitter which can be assigned by this second jitter generation unit 30 is limited to less than 0.5 (UIp−p).

The magnitude of Km is selected in a linear region of the quadrature modulator used, and Vd is decided based on Km and a phase shift amount to be realized.

FIG. 7 shows a signal waveform of the output signal S6 when km=0.22×π and Vd=1.

This waveform is obtained by synthesizing an amplitude-modulation wave and phase-modulation wave.

The second jitter generation unit 30 inputs the output signal S6 of this quadrature modulator 31 to the amplitude limiter 35 to remove amplitude-modulated components, thereby generating a signal S7 containing only phase-modulated components (jitter components).

Note that the amplitude limiter 35 can be easily formed by, for example, a limiter amplifier.

Figure 8:
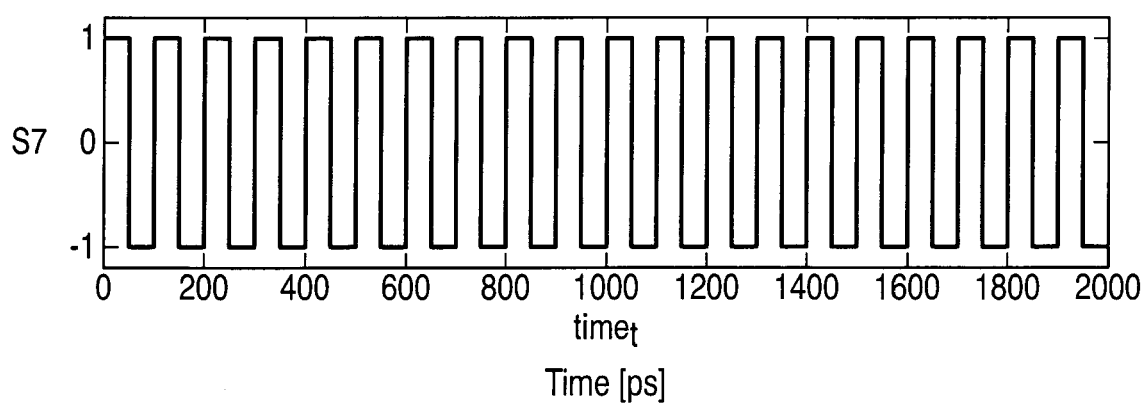
FIG. 8 is a chart for explaining a time waveform of an output from an amplitude limiter used in the jitter generation apparatus and jitter generation method according to the first embodiment of the present invention.
Figure 9:
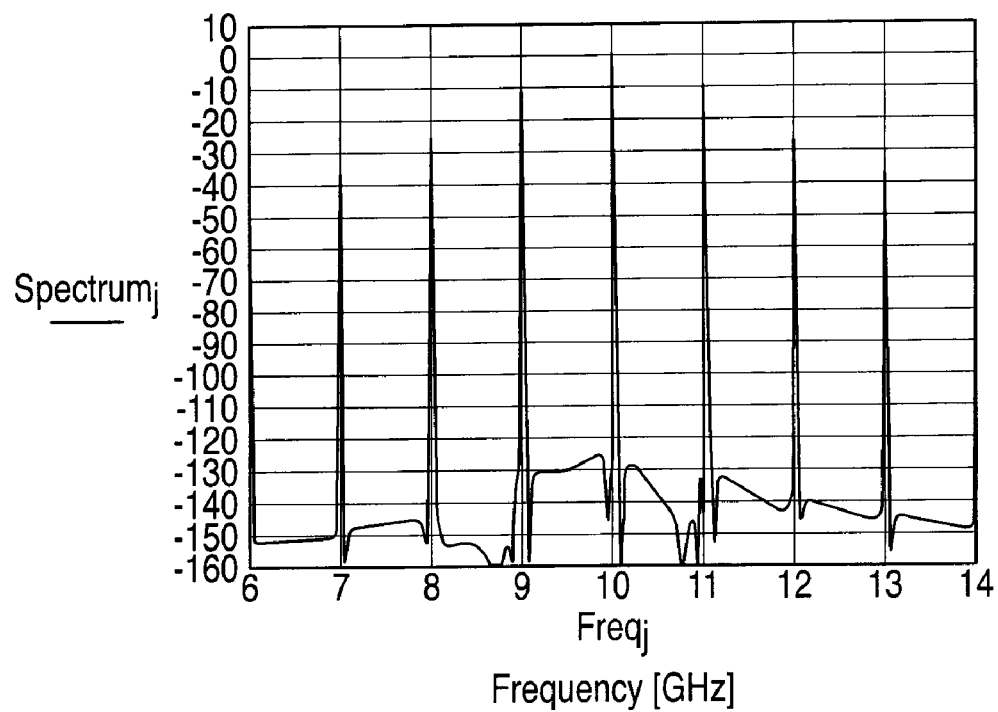
FIG. 9 is a graph for explaining a spectrum waveform of the amplitude limiter used in the jitter generation apparatus and jitter generation method according to the first embodiment of the present invention.

FIG. 8 shows a time waveform of the signal S7 obtained by multiplying the amplitude of the signal S6 by 20 and limiting it within a range of ±1. FIG. 9 shows a spectrum waveform of that signal S7. As can be seen from FIGS. 8 and 9, the amplitude-modulated components are removed, and only the phase-modulated components appear compared to the waveform shown in FIG. 7.

This second jitter generation unit 30 can control a jitter amount by the amplitude (Km) of the sinusoidal wave second modulation signal m2 and the voltage Vd of the DC signal D, which are input to the quadrature modulator 31.

For example, when the amplitude (Km) of the second modulation signal m2 is increased, the phase shift amount of the output signal S6 of the quadrature modulator 31, i.e., the jitter amount becomes larger.

Even when the voltage Vd of the DC signal D is decreased, a phase variation amount of the output signal S6 becomes larger. However, since the amplitude of the signal S6 becomes smaller, the amplitude limiting processing has to have a margin.

When a signal of a desired jitter amount is to be output, the second modulation signal m2 having an amplitude corresponding to the desired jitter amount may be supplied, while the voltage Vd of the DC signal D is fixed, and the relationship between the amplitude (Km) of the second modulation signal m2 and the jitter amount of the signal S7 after the amplitude limiting processing is calculated in advance.

In this case, for example, spectral powers of a carrier and side band of the signal S7 are measured while changing the amplitude of the second modulation signal m2, and jitter amounts are calculated using a known formula that expresses the relationship between the spectral powers and jitter amount, and the relationship between the amplitudes of the modulation signal m2 and the jitter amounts is then calculated.

Figure 10:
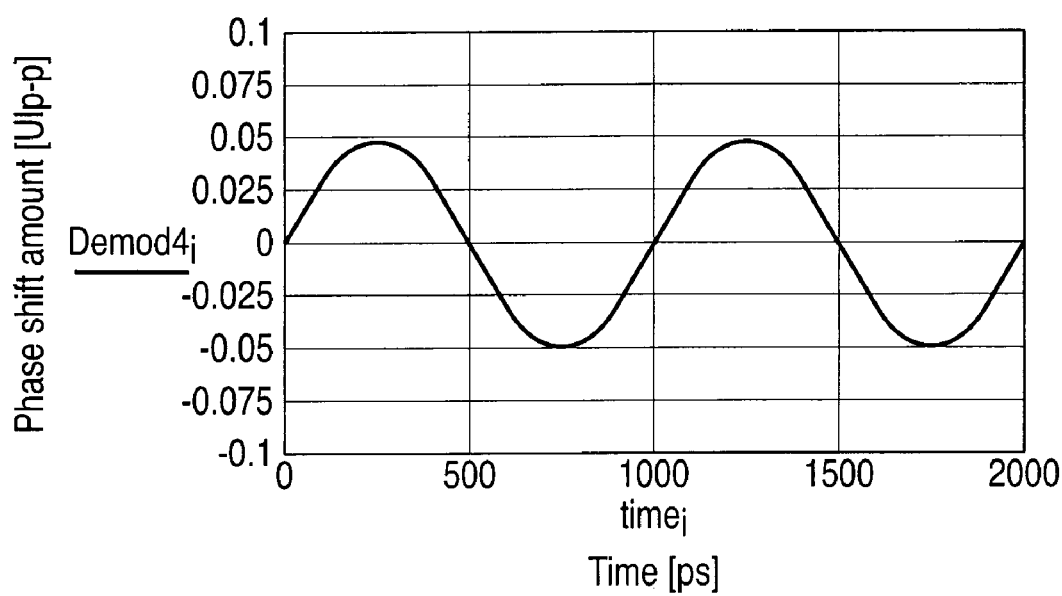
FIG. 10 is a graph for explaining a demodulated waveform of a signal assigned with a sinusoidal wave jitter by a second jitter generation unit used in the jitter generation apparatus and jitter generation method according to the first embodiment of the present invention.

FIG. 10 shows a waveform (phase locus waveform) of a signal obtained by demodulating a signal assigned with a sinusoidal wave jitter having a jitter amplitude=0.1 (UIp−p) and a jitter frequency=1 GHz (a cycle=1000 ps) by the second jitter generation unit 30 using a sinusoidal wave signal generator 32a shown in (a) of FIG. 19 as the modulation signal generator 32 which generates the second modulation signal m2, as will be described later.

FIG. 11 shows a waveform (phase locus waveform) of a signal obtained by demodulating a signal assigned with a triangular wave jitter having the same jitter amplitude and jitter frequency as those of the sinusoidal wave jitter by the second jitter generation unit 30 using a triangular wave signal generator 32b shown in (b) of FIG. 19 as the modulation signal generator 32 which generates the second modulation signal m2, as will be described later.

FIG. 20 shows a waveform (phase locus waveform) of a signal obtained by demodulating a signal assigned with a rectangular wave jitter having a jitter amplitude=0.1 (UIp−p) and a jitter frequency=1 GHz (a cycle=1000 ps) by the second jitter generation unit 30 using a rectangular wave signal generator 32c shown in (c) of FIG. 19 as the modulation signal generator 32 which generates the second modulation signal m2, as will be described later.

That is, FIGS. 10, 11, and 20 respectively show phase locus waveforms of output signals Y(t)' obtained when a sinusoidal wave AC signal, triangular wave AC signal, and rectangular wave AC signal are used under the condition of Km=0.1π and the modulation signal cycle=1000 ps.

All of the demodulated signal waveforms shown in FIGS. 10, 11, and 20 accurately correspond to the waveform of the second modulation signal to which a jitter is assigned to have a low distortion.

As described above, this embodiment can cover the full regions of the aforementioned jitter mask shown in FIG. 2, since the first jitter generation unit 21 using the aforementioned PLL circuit 22 generates jitters in the first jitter region A, which corresponds to a low-frequency region (9 Hz to 4 MHz) and a large amplitude range (0.22 UI or more), and the second jitter generation unit 30 of quadrature modulation type generates jitters in the second jitter region B, which corresponds to a full frequency band (9 Hz to 2 GHz) and a small amplitude range (less than 0.22 UI).

Note that when the non-modulation signal S5 is used as a quadrature modulation local signal of the second jitter generation unit 30, as described above, the switch 34 supplies the outputs from the modulation signal generator 32 and DC signal generator 33 to the quadrature modulator 31.

Therefore, when the first jitter generation unit 21 assigns a jitter, since the switch 34 inputs signals, at least one of which assumes zero and the other of which assumes a nonzero fixed value (e.g., 1), to the quadrature modulator 31, the output signal S5 of the first jitter generation unit 21 passes through the quadrature modulator 31 intact, and is then output via the amplitude limiter 35.

The control unit 41 controls the operations of the first jitter generation unit 21 and second jitter generation unit 30 as well as switching of this switch 34.

The control unit 41 controls the aforementioned units based on parameters (output frequency, jitter frequency, and jitter amplitude) designated by the parameter setting means 40.

That is, the control unit 41 determines which of the first jitter region A and second jitter region B in the jitter mask includes a position decided by the parameters (output frequency, jitter frequency, and jitter amplitude) designated by the parameter setting means 40.

When the control unit 41 determines that a jitter designated by the parameter setting means 40 is included in the first jitter region A, it sets the local signal frequencies of the frequency conversion circuits 26 and 28 of the frequency conversion unit 25, so that the frequency of the output signal S5 from the first jitter generation unit 21 equals the designated output frequency, sets the output signal frequency of the modulation signal generator 22a of the PLL circuit 22, so that the frequency of a jitter to be assigned to the signal S5 equals the designated jitter frequency, and sets the attenuation amounts of the ATTs 22c and 22i as the first and second level control means to be predetermined values, so that the amplitude of the jitter to be assigned to the signal S5 equals the designated jitter amplitude.

With this processing, the first jitter generation unit 21 outputs the signal S5 assigned with the jitter according to the designated parameters.

At this time, since the switch 34 undergoes the switching control of the control unit 41 to input, e.g., 1 and 0 to the quadrature modulator 31 of the second jitter generation unit 30, the signal S5 passes through the quadrature modulator 31 and is output via the amplitude limiter 35.

When the control unit 41 determines that a jitter designated by the parameter setting means 40 is included in the second jitter region B, it sets the local signal frequencies of the frequency conversion circuits 26 and 28 of the frequency conversion unit 25, so that the frequency of the output signal S5 from the first jitter generation unit 21 equals the designated output frequency, stops the output of the modulation signal generator 22a of the PLL circuit 22 and fixes the frequency division ratio of the variable frequency divider 22k, so that a jitter to be assigned to the signal S5 becomes zero (it is not modulated), and sets the attenuation amounts of the ATTs 22c and 22i as the first and second level control means to be maximum values.

These settings are to control the ATTs 22c and 22i as the first and second level control means, so as not to apply phase modulation to the signal S5 as a local signal input to the quadrature modulator 31.

With this processing, the first jitter generation unit 21 outputs a non-modulated signal S5 at the output frequency designated by the parameter setting means 40.

At this time, the switch 34 undergoes the switching control of the control unit 41 to input the second modulation signal m2 and DC signal D corresponding to the jitter frequency and jitter amplitude designated by the parameter setting means 40 to the quadrature modulator 31 of the second jitter generation unit 30.

Then, the quadrature modulator 31 outputs the amplitude-modulated signal S6 assigned with a jitter corresponding to the designated parameters at that time.

Also, the amplitude limiter 35 outputs the signal S7 with a desired jitter by removing the amplitude-modulated components of the amplitude-modulated signal S6 assigned with the jitter at that time.

In this manner, the jitter generation apparatus 20 according to the first embodiment includes the second jitter generation unit 30 based on the quadrature modulation method, which can generate small-amplitude jitters over a broad band by a simple arrangement.

Since the jitter generation apparatus 20 according to the first embodiment is configured to use the first jitter generation unit 21 of the PLL arrangement, which can assign large-amplitude jitters for the first jitter region A which corresponds to a low-frequency band less than the frequency f3 and a large-amplitude range exceeding the amplitude J2 of the range of the jitter mask, and to use the second jitter generation unit 30 based on the quadrature modulation method for the second jitter region B including at least a region equal to or higher than the frequency f3 and equal to or smaller than the amplitude J2, jitters within the jitter masks ranging from several Hz to several GHz can be easily generated by a simple arrangement.

Note that in the first embodiment, the output signal S5 assigned with a jitter by the first jitter generation unit 21 is output while passing through the quadrature modulator 31 of the second jitter generation unit 30.

Hence, the apparatus may be configured to output the output signal S5 assigned with the jitter by the first jitter generation unit 21 independently of the quadrature modulator 31 of the second jitter generation unit 30 via a switch (not shown).

In the first embodiment, when the second jitter generation unit 30 assigns a jitter, it uses a non-modulated output signal of the first jitter generation unit 21 as a local signal, thus simplifying the arrangement.

Hence, the apparatus may be configured to supply a local signal from a signal generator independently of the first jitter generation unit 21 to the quadrature modulator 31.

In the first embodiment, a region where the jitter frequency is less than f3 and the jitter amplitude is equal to or smaller than J2 is included in the second jitter region B using the jitter mask shown in FIG. 2.

Hence, an arbitrary method of selectively using the regions A and B of the jitter mask may be used as long as the first jitter region A which corresponds to a frequency range from the lower limit frequency f1 to a specific frequency (not limited to f3) lower than the upper limit frequency f4 and includes a region larger than a specific amplitude Jr (not limited to J2), and the second jitter region B which corresponds to a frequency range from the upper limit frequency f4 to a certain frequency lower than the frequency f4 and does not overlap the first jitter region A can be obtained.

Second Embodiment

In this second embodiment, a first jitter region A may include a region in which a jitter frequency is less than f3 and a jitter amplitude is equal to or smaller than J2 and equal to or larger than J3 within a range of a jitter mask shown in, e.g., FIG. 12, and a first jitter generation unit 21 with a PLL arrangement may assign a jitter.

Third Embodiment

Figure 13:
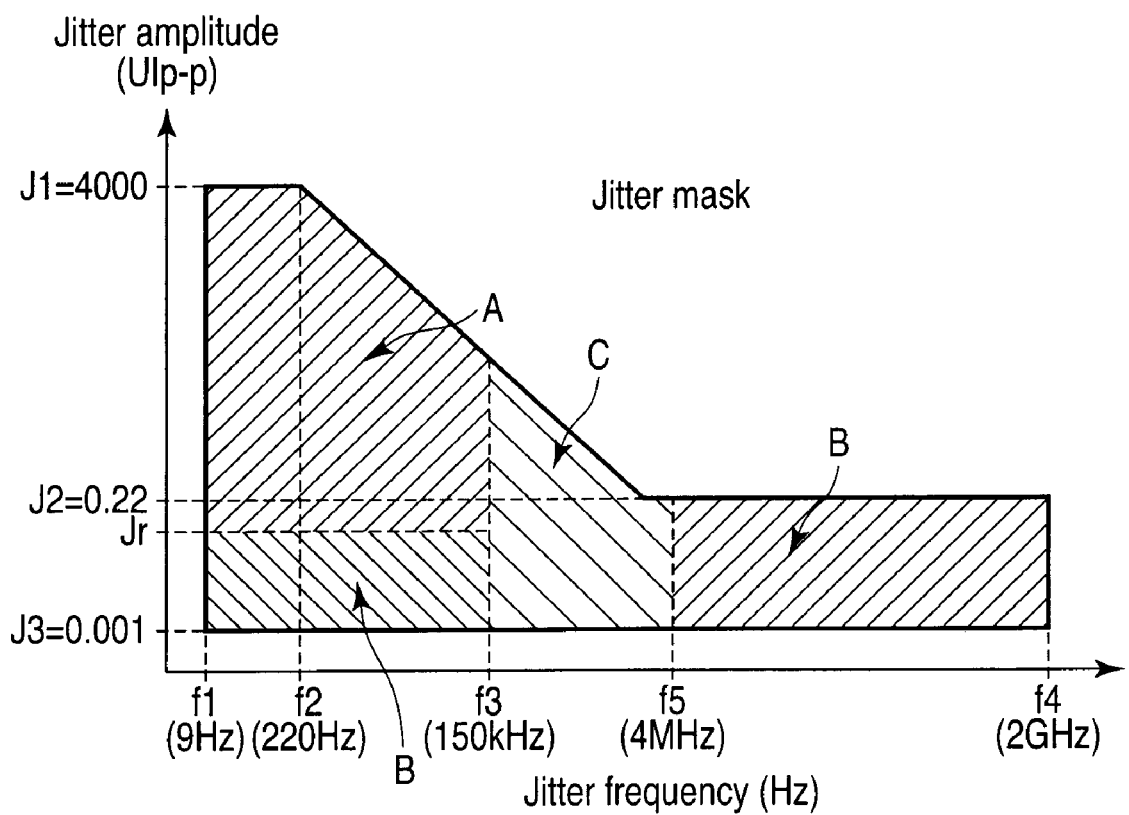
FIG. 13 is a graph for explaining an example of region divisions (four divisions) of a jitter mask used in a jitter generation apparatus and jitter generation method according to the third embodiment of the present invention.
Figure 18:
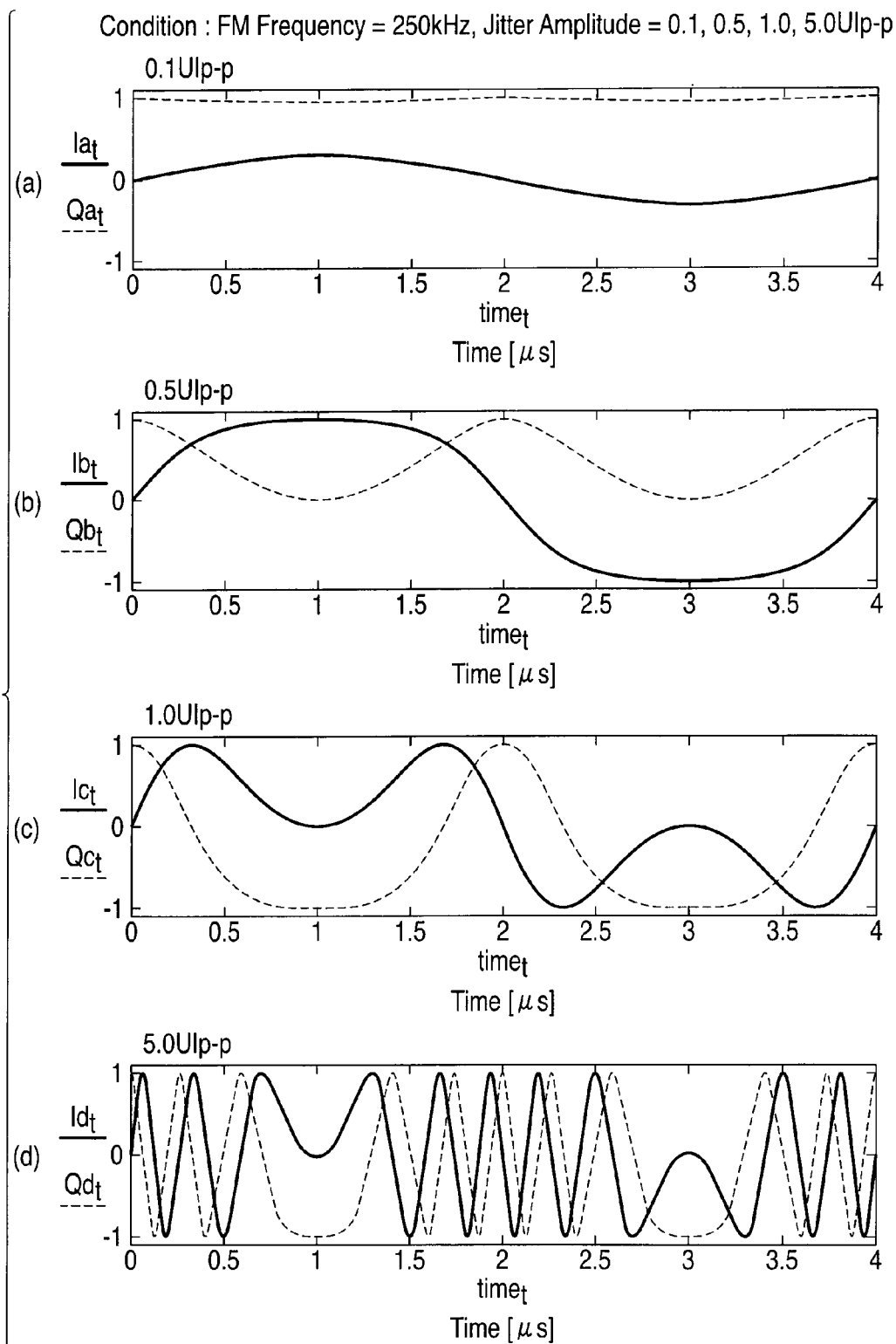
FIG. 18 shows charts for explaining waveform examples of modulation signals of the conventional method.

In the third embodiment, a range in which a jitter frequency ranges from f3 to a frequency f5 lower than an upper limit frequency may be set as a third jitter region C within a range of a jitter mask shown in FIG. 13, and jitter assignment for this third jitter region C may be done by a quadrature modulation method using a special waveform signal described in non-patent document 1 shown in FIG. 18.

Figure 14:
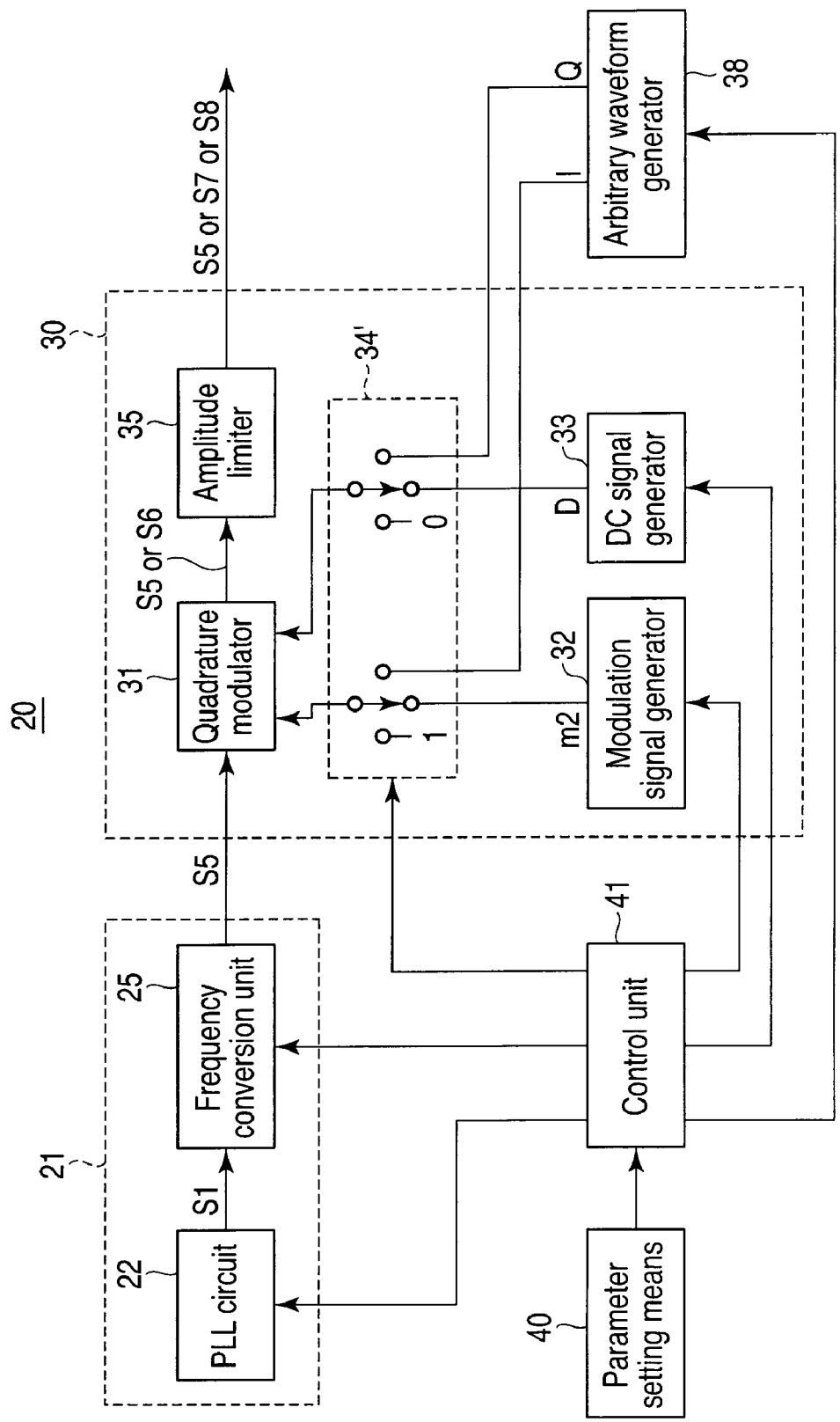
FIG. 14 is a block diagram for explaining an example of the principal part arrangement of an arbitrary waveform generator used in the jitter generation apparatus according to the third embodiment of the present invention.

In case of this third embodiment, as shown in FIG. 14, arbitrary waveform signals I and Q from an arbitrary waveform generator 38 can be supplied to a quadrature modulator 31 via a three-contact type switch 34'.

Note that since the arrangement in FIG. 14 other than that described above is the same as that of the jitter generation apparatus 20 shown in FIG. 1 of the first embodiment, the same reference numerals denote the same parts as in FIG. 1, and a detailed description thereof will not be repeated.

Note that a lower limit Jr of a jitter amplitude in a first jitter region A in FIG. 13 is set to be smaller than J2 (<0.22 (UIp–p)).

Hence, the lower limit Jr of the jitter amplitude of this first jitter region A may be set to be equal to or larger than J2.

However, in this case, in terms of a characteristic feature of a second jitter generation unit 30 which generates a signal assigned with a jitter in a second jitter region B, the lower limit Jr of the jitter amplitude of the first jitter region A has to be set to be less than 0.5 (UIp–p).

Fourth Embodiment

In FIG. 14, the arbitrary waveform signals from the arbitrary waveform generator 38 are input to the quadrature modulator 31 of the second jitter generation unit 30 via the switch 34'.

Hence, in the fourth embodiment, a third jitter generation unit 50 may be formed by a quadrature modulator 51 which receives a non-modulated output signal S5 from a first jitter generation unit 21 as a local signal, and an arbitrary waveform generator 52 which inputs arbitrary waveform signals I and Q to the quadrature modulator 51, as shown in FIG. 15. The third jitter generation unit 50 may generate a jitter in a third jitter region C, and an output signal S8 of the third jitter generation unit 50 may be selectively output via a switch 55.

Note that since the arrangement in FIG. 15 other than that described above is the same as that of the jitter generation apparatus 20 shown in FIG. 1 of the first embodiment, the same reference numerals denote the same parts as in FIG. 1, and a detailed description thereof will not be repeated.

Fifth Embodiment

Each of the above embodiments has exemplified the case in which the second jitter generation unit 30 which uses the sinusoidal wave signal generator 32a shown in (a) of FIG. 19 as the modulation signal generator 32 which generates the second modulation signal m2 assigns a sinusoidal wave jitter to a signal.

Hence, in the fifth embodiment, a triangular wave jitter can be generated by a second jitter generation unit 30 which uses a triangular wave signal generator 32b shown in (b) of FIG. 19 as a modulation signal generator 32 which generates a second modulation signal m2, and a synthesized jitter can also be generated by superposing these jitters.

Sixth Embodiment

In the sixth embodiment, a second jitter generation unit 30 which uses a rectangular wave signal generator 32c shown in (c) of FIG. 19 as a modulation signal generator 32 which generates a second modulation signal m2 can generate a rectangular wave jitter.

Seventh Embodiment

The seventh embodiment of the present invention for generating a BUJ (Bounded Uncorrelated Jitter) which is generated by band-limiting a PRBS (Pseudo Random Binary Sequence) and whose frequency distribution with respect to a jitter amplitude is approximate to a Gaussian distribution will be described below.

As disclosed in the 15th page of non-patent document 1, the BUJ includes an HPJ (High Probability Jitter) and a BGJ (Bounded Gaussian Jitter) compliant with the standard CEI-0 2.0.

Generation of the HPJ will be described below.

A control signal required to generate the HPJ is obtained by band-limiting the PRBS using a low-pass filter (LPF) of at least first-order having a cutoff frequency $\frac{1}{20}$ to $\frac{1}{10}$ of the bit rate of the PRBS.

As for the PRBS, the number of stages of a shift register used to generate the PRBS is set to be 7 to 11, and the bit rate is set to be $\frac{1}{10}$ to $\frac{1}{3}$ of a data rate of a DUT to be tested.

The frequency distribution of the HPJ with respect to the jitter amplitude is symmetric about a jitter amplitude=0 ps.

Generation of the BGJ will be described below.

A control signal required to generate the BGJ is obtained by band-limiting the PRBS having the number of stages=31 and a bit rate=2 GHz by an LPF having a cutoff frequency=100 MHz.

A PRBS cycle required to generate the HPJ is at most $2^{11}-1=2047$ (bits), but a PRBS cycle required to generate the BGJ is $2^{31}-1=2147483647$ (bits) and is predominantly longer than that required to generate the HPJ.

For this reason, the frequency distribution of the BGJ is more approximate to the Gaussian distribution than that of the HPJ.

Note that the sinusoidal wave jitter, triangular wave jitter, rectangular wave jitter, and bounded uncorrelated jitter have a generic name "PJ (Periodic Jitter)".

Also, the PJ and a DDJ (Data Dependent Jitter) are called a DJ (Deterministic Jitter) in combination.

Since a PRBS mark ratio is approximate to 0.5 (a mark ratio in case of seven stages is 0.504, and approaches 0.5 with increasing number of stages), DC components in the control signal obtained by band-limiting the PRBS are sufficiently smaller than AC components.

Therefore, in the seventh embodiment, a second jitter generation unit 30 uses a PRBS control signal generator 32d including a PRBS generator 32e which generates the PRBS and a filter 32f which band-limits the PRBS output from the PRBS generator 32e at a desired frequency to obtain a control signal, as shown in (d) of FIG. 19, as a modulation signal generator 32 which generates a second modulation signal m2. Then, a bounded uncorrelated jitter (BUJ) whose frequency distribution with respect to a jitter amplitude is approximate to a Gaussian distribution can be generated.

Eighth Embodiment

In the eighth embodiment, as a modulation signal generator 32 which generates a second modulation signal m2, an RJ (Random Jitter) which generates white noise can be generated, as shown in (e) of FIG. 19.

Ninth Embodiment

Furthermore, in this ninth embodiment, a second jitter generation unit 30 uses a synthesized signal generator 32i which includes the aforementioned sinusoidal wave signal generator 32a, triangular wave signal generator 32b, rectangular wave signal generator 32c, PRBS control signal generator 32d including the PRBS generator 32e and filter 32f used to generate a BUJ, a noise generator 32g, and a synthesizer 32h, as shown in FIG. 21, as a modulation signal generator 32 which generates a second modulation signal m2, and which generates a synthesized signal obtained by superposing at least two types out of a sinusoidal wave signal, triangular wave signal, rectangular wave signal, PRBS control signal used to generate a BUJ, and white noise by the synthesizer 32h. Thus, a jitter according to a waveform of the synthesized signal of these signals can be generated.

However, in a method in which the AC second modulation signal m2 and DC signal D are supplied to the quadrature modulator 31, and its output signal undergoes amplitude limiting processing as in the second jitter generation unit 30, when a jitter in each of the aforementioned first to eighth embodiments or a jitter according to the waveform of the synthesized signal in the ninth embodiment is to be generated, a DC average value of any one of the sinusoidal wave, triangular wave, rectangular wave, PRBS control signal, and white noise to be supplied as the second modulation signal m2 to one phase of the quadrature modulator 31 or a DC average value of a synthesized wave obtained by superposing at least two types out of these signals is required to be zero or sufficiently approximate to zero.

That is, in this case, when a DC component is large, the modulation signal waveform cannot correspond to a phase shift by a jitter to be actually assigned under the influence of the DC component.

10th Embodiment

FIG. 16 shows the arrangement of a device test system 60 according to the 10th embodiment using the jitter generation apparatus 20 according to any of the aforementioned first to ninth embodiments.

This device test system 60 includes a jitter generation apparatus 20, pulse pattern generation apparatus 61, and error detection apparatus 62.

The jitter generation apparatus 20 outputs a signal Sj assigned with a jitter (one of S5, S7, and S8).

The pulse pattern generation apparatus 61 receives the signal Sj as an internal clock signal, and generates a digital signal sequence of a desired pattern, which is phase-modulated based on Sj.

An object to be measured 10 receives the digital signal sequence from the pulse pattern generation apparatus 61, and outputs a measurement signal.

The error detection apparatus 62 receives the measurement signal from the object to be measured 10, and detects bit errors of the measurement signal.

Note that the device test system 60 according to the 10th embodiment directly inputs an electric digital signal sequence output from the pulse pattern generation apparatus 61 to the object to be measured 10.

Hence, as indicated by the dotted lines in FIG. 16, by inputting the electric digital signal sequence to an optical intensity modulator 65, information of the electric digital signal sequence may be carried (to undergo optical intensity modulation) on light that enters the optical intensity modulator 65 so as to input a generated optical intensity modulation signal to the object to be measured 10.

In this case, a photoelectric converter (e.g., a photodiode) 66 has to be arranged before the error detection apparatus 62 to convert an optical signal output from the object to be measured 10 into an electric signal (corresponding to the measurement signal) and to then input the electric signal to the error detection apparatus 62.

A jitter generation apparatus, a device test system using the same, and a jitter generation method according to the present invention can be applied to jitter tolerance measurement that measures a tolerance level against a phase fluctuation (jitter) of a data signal as a measurement item for a data transmission system.

What is claimed is:

1. A jitter generation apparatus including an arrangement for applying phase modulation to a phase locked loop, which comprises:

voltage controlled oscillator means;

frequency divider means for frequency-dividing a frequency of a signal output from the voltage controlled oscillator means at a predetermined frequency division ratio;

phase comparator means for receiving an output from the frequency divider means at one input terminal, receiving a reference clock signal at the other input terminal, comparing the output from the frequency divider means with a phase of the reference clock signal, and outputting a signal corresponding to a phase difference between the output and the reference clock signal;

filter means for removing a predetermined frequency component from an output signal from the phase comparator means;

jitter addition means for outputting a signal by adding a predetermined jitter corresponding to an amplitude of a first modulation signal to an output signal from the filter means upon reception of the externally supplied first modulation signal, and controlling a frequency of the signal output from the voltage controlled oscillator means by the output signal added with the jitter; and frequency division ratio varying means for varying the frequency division ratio of the frequency divider means according to the amplitude of the first modulation signal upon reception of the first modulation signal, so as to vary the predetermined jitter added by the jitter addition means; wherein the apparatus further comprises:

first level control means for performing level control of the first modulation signal and applying a level-controlled first modulation signal to the jitter addition means;

second level control means for performing level control of first modulation signal and applying a level-controlled modulation signal to the frequency division ratio varying means;

parameter setting means for setting parameters associated with a desired jitter to be generated by the jitter generation apparatus;

a quadrature modulator which has a local signal input terminal and two modulation signal input terminals, allows a local signal which is input to the local signal input terminal and is output with the jitter added from the voltage controlled oscillator means to pass through the quadrature modulator, and quadrature-modulates a non-modulated local signal which is input to the local signal input terminal and is output without the jitter added from the voltage controlled oscillator means, based on a second modulation signal and outputs quadrature-modulated local signal, in accordance with input states to the two modulation signal input terminals;

amplitude limiting means for limiting an amplitude of the output signal from the quadrature modulator to a constant amplitude;

switching means configured to switch an input state to the two modulation signal input terminals of the quadrature modulator between a first state in which zero is input to one of the two modulation signal input terminals and a nonzero fixed value is input to the other, and a second state in which the second modulation signal is input to at least one of the two modulation signal input terminals; and a control unit which controls the jitter generation apparatus having the arrangement for applying the phase modulation to the PLL to finally output a signal added with the desired jitter based on the parameters set by the parameter setting means from the amplitude limiting means, respectively controls, when the switching means is switched to the first state as a result of switching control of the switching means to the first state or the second state, the first level control means and the second level control means so that the local signal, which is obtained by adding the desired jitter in which an amplitude of the first modulation signal matches the parameter set by the parameter setting means to the output signal from the voltage controlled oscillator means, passes through the quadrature modulator and is input to the amplitude limiting means, and respectively controls, when the switching means is switched to the second state, the first level control means and the second level control means so that an output, which is obtained by applying quadrature modulation to the non-modulated local signal which is input to the quadrature modulator without adding any jitter to the output signal from the voltage controlled oscillator means based on the second modulation signal, is input to the amplitude limiting means.

2. The jitter generation apparatus according to claim 1, wherein frequency conversion means, which is controlled by the control unit so that an output frequency matches a parameter set by the parameter setting means, is inserted between the voltage controlled oscillator means and the quadrature modulator.

3. The jitter generation apparatus according to claim 2, wherein the frequency conversion means includes a PLL arrangement.

4. The jitter generation apparatus according to claim 1, wherein in the second state in which the second modulation signal is input to one of the two modulation signal input terminals of the quadrature modulator, a DC signal is input to the other of the two modulation signal input terminals.

5. The jitter generation apparatus according to claim 1, further comprising first modulation signal generation means for generating the first modulation signal.

6. The jitter generation apparatus according to claim 5, wherein the first modulation signal generation means comprises a modulation signal generator having a direct digital synthesizer arrangement, which is controlled by the control unit so that a frequency of the first modulation signal matches a parameter set by the parameter setting means.

7. The jitter generation apparatus according to claim 1, further comprising modulation signal generation means for generating the second modulation signal.

8. The jitter generation apparatus according to claim 7, wherein the modulation signal generation means includes at least one of a sinusoidal wave signal generator, a triangular wave signal generator, a rectangular wave signal generator, a pseudo random binary sequence (PRBS) control signal generator, and a white noise generator, or means for generating a synthesized wave signal obtained by synthesizing at least two types of signals therefrom.

9. The jitter generation apparatus according to claim 1, wherein the quadrature modulator applies quadrature modulation to a local signal, which is input from the voltage controlled oscillator means to the local signal input terminal in a third state, based on arbitrary waveform signals of two phases output from an arbitrary waveform generator to one and the other of the two modulation signal input terminals, and outputs the quadrature-modulated local signal as a signal added with the desired jitter based on the parameters set by the parameter setting means, the switching means is configured to switch to the third state in which the arbitrary waveform signals of the two phases are input from the arbitrary waveform generator to one and the other of the two modulation signal input terminals, and when the switching means is switched to the third state as a result of switching control of the switching means to the third state based on the parameters set by the parameter setting means, the control unit respectively controls the first level control means and the second level control means so as not to add any jitter to the output signal from the voltage controlled oscillator means.

10. The jitter generation apparatus according to claim 1, further comprising:

a second quadrature modulator which has a local signal input terminal and two modulation signal input terminals, applies quadrature modulation to a local signal, which is input from the voltage controlled oscillator means to the local signal input terminal, based on arbitrary waveform signals of two phases output from an arbitrary waveform generator to one and the other of the two modulation signal input terminals, and outputs the quadrature-modulated local signal as a signal added with a jitter based on the parameters set by the parameter setting means; and second switching means for switching to output an output signal from the amplitude limiting means in the first state and the second state, and to output an output signal from the second quadrature modulator in a third state, wherein when the second switching means is switched to the third state as a result of switching control of the second switching means to the third state based on the parameters set by the parameter setting means, the control unit respectively controls the first level control means and the second level control means so as not to add any jitter to an output signal from the voltage controlled oscillator means.

11. A jitter generation method for generating a signal assigned with a jitter within a range of a jitter mask specified by upper and lower limit jitter frequencies and upper and lower limit jitter amplitudes, which comprises the steps of:

preparing a first jitter generation unit which generates a signal assigned with a jitter in a first jitter region which corresponds to a range of a jitter frequency from the lower limit frequency to a frequency lower than the upper limit frequency, and in which a jitter amplitude is not less than a reference amplitude, within the range of the jitter mask;

preparing a second jitter generation unit which generates a signal assigned with a jitter in a second jitter region which corresponds to a range of a jitter frequency from the upper limit frequency to a frequency higher than the lower limit frequency, in which a jitter amplitude is not more than the reference amplitude, and which does not overlap the first jitter region, within the range of the jitter mask; and preparing parameter setting means for setting parameters associated with a desired jitter to be generated within the range of the jitter mask, wherein the first jitter generation unit generates a signal assigned with a jitter by a PLL circuit that allows phase modulation by a first modulation signal when the first jitter generation unit generates the signal assigned with the jitter in the first jitter region based on the parameters set by the parameter setting means and generates a signal in a non-modulated state without any jitter assigned when the second jitter generation unit generates the signal assigned with the jitter in the second jitter region, and the second jitter generation unit uses quadrature modulator means for applying quadrature modulation to the signal in the non-modulated state without any jitter assigned, which signal is generated by the PLL circuit of the first jitter generation unit, when the second jitter generation unit generates the signal assigned with the jitter in the second jitter region based on the parameters set by the parameter setting means.

12. The jitter generation method according to claim 11, wherein the step of preparing a second jitter generation unit comprises the steps of:

preparing modulation signal generation means for generating an AC modulation signal and a DC signal of a predetermined voltage;

preparing the quadrature modulator means for quadrature-modulating an input signal when the AC modulation signal is input to one phase and the DC signal is input to the other phase; and preparing amplitude limiting means for performing amplitude limiting processing to an output signal from the quadrature modulator means, and outputting a modulated signal, a phase of which is modulated based on the modulation signal.

13. The jitter generation method according to claim 11, wherein a region in which a jitter frequency is less than a frequency lower than the upper limit frequency, and a jitter amplitude is not more than the reference amplitude and is not less than a lower limit value within the range of the jitter mask is included in the first jitter region.

14. The jitter generation method according to claim 11, wherein a range of a jitter frequency which ranges from a first frequency lower than the upper limit frequency to a frequency that is higher than the first frequency and is lower than the upper limit frequency is set as a third jitter region, and the method further comprises the step of preparing a third jitter generation unit which generates a signal assigned within a jitter associated with the third jitter region.

15. A device test system using a jitter generation apparatus according to claim 1, comprising:

a pulse pattern generation apparatus which receives a signal output from the jitter generation apparatus as a clock signal, and generates a digital signal sequence of a desired pattern, a phase of which is modulated based on the clock signal; and a bit error detection apparatus which detects a bit error of a digital signal sequence output from an object to be measured that receives the digital signal sequence generated by the pulse pattern generation apparatus.

16. A device test system using a jitter generation apparatus according to claim 2, comprising:

a pulse pattern generation apparatus which receives a signal output from the jitter generation apparatus as a clock signal, and generates a digital signal sequence of a desired pattern, a phase of which is modulated based on the clock signal; and a bit error detection apparatus which detects a bit error of a digital signal sequence output from an object to be measured that receives the digital signal sequence generated by the pulse pattern generation apparatus.

17. A device test system using a jitter generation apparatus according to claim 4, comprising:

a pulse pattern generation apparatus which receives a signal output from the jitter generation apparatus as a clock signal, and generates a digital signal sequence of a desired pattern, a phase of which is modulated based on the clock signal; and a bit error detection apparatus which detects a bit error of a digital signal sequence output from an object to be measured that receives the digital signal sequence generated by the pulse pattern generation apparatus.

18. A device test system using a jitter generation apparatus according to claim 5, comprising:

a pulse pattern generation apparatus which receives a signal output from the jitter generation apparatus as a clock signal, and generates a digital signal sequence of a desired pattern, a phase of which is modulated based on the clock signal; and a bit error detection apparatus which detects a bit error of a digital signal sequence output from an object to be measured that receives the digital signal sequence generated by the pulse pattern generation apparatus.

19. A device test system using a jitter generation apparatus according to claim 7, comprising:

a pulse pattern generation apparatus which receives a signal output from the jitter generation apparatus as a clock signal, and generates a digital signal sequence of a desired pattern, a phase of which is modulated based on the clock signal; and a bit error detection apparatus which detects a bit error of a digital signal sequence output from an object to be measured that receives the digital signal sequence generated by the pulse pattern generation apparatus.

20. A device test system using a jitter generation apparatus according to claim 9, comprising:

a pulse pattern generation apparatus which receives a signal output from the jitter generation apparatus as a clock signal, and generates a digital signal sequence of a desired pattern, a phase of which is modulated based on the clock signal; and a bit error detection apparatus which detects a bit error of a digital signal sequence output from an object to be measured that receives the digital signal sequence generated by the pulse pattern generation apparatus.

21. A device test system using a jitter generation apparatus according to claim 10, comprising:

a pulse pattern generation apparatus which receives a signal output from the jitter generation apparatus as a clock signal, and generates a digital signal sequence of a desired pattern, a phase of which is modulated based on the clock signal; and a bit error detection apparatus which detects a bit error of a digital signal sequence output from an object to be measured that receives the digital signal sequence generated by the pulse pattern generation apparatus.

* * * * *